US012660348B2

(12) United States Patent
Tu et al.

(10) Patent No.: US 12,660,348 B2
(45) Date of Patent: Jun. 16, 2026

(54) IMAGE SENSOR

(71) Applicant: VisEra Technologies Company Ltd.,
Hsin-Chu City (TW)

(72) Inventors: Zong-Ru Tu, Hsin-Chu City (TW);
Han-Sheng Chen, Hsin-Chu City
(TW); Yu-Chi Chang, Hsin-Chu City
(TW); Han-Lin Wu, Hsin-Chu City
(TW)

(73) Assignee: VisEra Technologies Company Ltd.,
Hsin-Chu City (TW)

( * ) Notice: Subject to any disclaimer, the term of this
patent is extended or adjusted under 35
U.S.C. 154(b) by 113 days.

(21) Appl. No.: 18/734,717

(22) Filed: Jun. 5, 2024

(65) Prior Publication Data

US 2025/0380520 A1     Dec. 11, 2025

(51) Int. Cl.
*H10F 39/00* (2025.01)
*H10F 39/18* (2025.01)
(52) U.S. Cl.
CPC ......... *H10F 39/8053* (2025.01); *H10F 39/18*
(2025.01); *H10F 39/8027* (2025.01); *H10F*
*39/8057* (2025.01)

(58) Field of Classification Search
CPC .. H10F 39/8053; H10F 39/18; H10F 39/8027;
H10F 39/8057
See application file for complete search history.

(56) References Cited

U.S. PATENT DOCUMENTS

2022/0384507 A1* 12/2022 Park ................... H10F 39/8053

* cited by examiner

*Primary Examiner* — Tony Ko
(74) *Attorney, Agent, or Firm* — MUNCY, GEISSLER,
OLDS & LOWE, P.C.

(57) ABSTRACT

The present disclosure provides an image sensor including a
unit. The unit includes a phase detection auto focus (PDAF)
pixel, sensing pixels, and a light-shielding grid. The PDAF
pixel is on a substrate, in which the PDAF pixel includes
four photodiodes and a first color filter layer on the four
photodiodes. The sensing pixels are on the substrate and
surround the PDAF pixel, in which each of the sensing
pixels includes a single photodiode and a second color filter
layer on the single photodiode. The light-shielding grid
surrounds the first color filter layer, in which the light-
shielding grid includes a first portion and a second portion
from a top view, the first portion is closer to a center of the
substrate than the second portion, and a width of the first
portion is larger than a width of the second portion.

20 Claims, 13 Drawing Sheets

A-A

10PX

IMAGE SENSOR

BACKGROUND

Field of Invention

The present disclosure relates to an image sensor.

Description of Related Art

The phase detection autofocus (PDAF) pixels may be used in image sensors, such as the charge-coupled device (CCD), the complementary metal oxide semiconductor (COMS) sensor, etc., to perform autofocus. However, although the microlens having a smaller radius of curvature disposed on the PDAF pixel may increase the sensitivity of the PDAF pixel, the undesired cross-talk between the sensing pixels near the PDAF pixel may increase owing to the curvature of the microlens disposed on the PDAF pixel. Specifically, the microlens with a smaller radius of curvature may occupy less space on the PDAF pixel, so more light, such as the light with a large angle of incidence, may not be blocked by the microlens to enter the sensing pixel next to the PDAF pixel. Once more light enters the sensing pixel next to the PDAF pixel, the received light between the sensing pixel next to the PDAF pixel and the sensing pixel farther away from the PDAF pixel may be dramatically different to cause the detection cross-talk. Therefore, it is necessary to develop an image sensor with improved sensitivity in the PDAF pixel and reduced cross-talk between the sensing pixels.

SUMMARY

The present disclosure provides an image sensor including a unit. The unit includes a phase detection auto focus (PDAF) pixel, sensing pixels, and a light-shielding grid. The PDAF pixel is on a substrate, in which the PDAF pixel includes four photodiodes and a first color filter layer on the four photodiodes. The sensing pixels are on the substrate and surround the PDAF pixel, in which each of the sensing pixels includes a single photodiode and a second color filter layer on the single photodiode. The light-shielding grid surrounds the first color filter layer, in which the light-shielding grid includes a first portion and a second portion from a top view, the first portion is closer to a center of the substrate than the second portion, and a width of the first portion is larger than a width of the second portion.

In some embodiments, from the top view, the substrate has a positive X-axis extending from the center of the substrate to a right edge of the substrate, the unit is on the positive X-axis, and the first portion of the light-shielding grid is on the left of the first color filter layer.

In some embodiments, the image sensor further includes a light-absorbing grid surrounding the second color filter layer of one of the sensing pixels on the right of the PDAF pixel in the unit from the top view, in which the light-absorbing grid includes a first portion and a second portion, the first portion of the light-absorbing grid is on the right of the one of the sensing pixels, and a width of the first portion of the light-absorbing grid is larger than a width of the second portion of the light-absorbing grid.

In some embodiments, from the top view, the substrate has a negative X-axis extending from the center of the substrate to a left edge of the substrate, the unit is on the negative X-axis, and the first portion of the light-shielding grid is on the right of the first color filter layer.

In some embodiments, the image sensor further includes a light-absorbing grid surrounding the second color filter layer of one of the sensing pixels on the left of the PDAF pixel in the unit from the top view, in which the light-absorbing grid includes a first portion and a second portion, the first portion of the light-absorbing grid is on the left of the one of the sensing pixels, and a width of the first portion of the light-absorbing grid is larger than a width of the second portion of the light-absorbing grid.

In some embodiments, from the top view, the substrate has a positive Y-axis extending from the center of the substrate to a top edge of the substrate, the unit is on the positive Y-axis, and the first portion of the light-shielding grid is on the bottom of the first color filter layer.

In some embodiments, the image sensor further includes a light-absorbing grid surrounding the second color filter layer of one of the sensing pixels on the top of the PDAF pixel in the unit from the top view, in which the light-absorbing grid includes a first portion and a second portion, the first portion of the light-absorbing grid is on the top of the one of the sensing pixels, and a width of the first portion of the light-absorbing grid is larger than a width of the second portion of the light-absorbing grid.

In some embodiments, from the top view, the substrate has a negative Y-axis extending from the center of the substrate to a bottom edge of the substrate, the unit is on the negative Y-axis, and the first portion of the light-shielding grid is on the top of the first color filter layer.

In some embodiments, the image sensor further includes a light-absorbing grid surrounding the second color filter layer of one of the sensing pixels on the bottom of the PDAF pixel in the unit from the top view, in which the light-absorbing grid includes a first portion and a second portion, the first portion of the light-absorbing grid is on the bottom of the one of the sensing pixels, and a width of the first portion of the light-absorbing grid is larger than a width of the second portion of the light-absorbing grid.

In some embodiments, from the top view, the substrate has an upper-right area between a positive X-axis and a positive Y-axis, the positive X-axis and the positive Y-axis extend from the center of the substrate to a right edge and to a top edge of the substrate, respectively, the unit is on the upper-right area, and the first portion of the light-shielding grid is on the left and on the bottom of the first color filter layer.

In some embodiments, the image sensor further includes a first light-absorbing grid surrounding the second color filter layer of one of the sensing pixels on the right of the PDAF pixel and a second light-absorbing grid surrounding the second color filter layer of another one of the sensing pixels on the top of the PDAF pixel in the unit from the top view, in which the first light-absorbing grid includes a first portion and a second portion, the first portion of the first light-absorbing grid is on the right of the one of the sensing pixels, and a width of the first portion of the first light-absorbing grid is larger than a width of the second portion of the first light-absorbing grid; and the second light-absorbing grid includes a first portion and a second portion, the first portion of the second light-absorbing grid is on the top of the another one of the sensing pixels, and a width of the first portion of the second light-absorbing grid is larger than a width of the second portion of the second light-absorbing grid.

In some embodiments, from the top view, the substrate has an upper-left area between a negative X-axis and a positive Y-axis, the negative X-axis and the positive Y-axis extend from the center of the substrate to a left edge and to a top edge of the substrate, respectively, the unit is on the upper-left area, and the first portion of the light-shielding grid is on the right and on the bottom of the first color filter layer.

In some embodiments, the image sensor further includes a first light-absorbing grid surrounding the second color filter layer of one of the sensing pixels on the left of the PDAF pixel and a second light-absorbing grid surrounding the second color filter layer of another one of the sensing pixels on the top of the PDAF pixel in the unit from the top view, in which the first light-absorbing grid includes a first portion and a second portion, the first portion of the first light-absorbing grid is on the left of the one of the sensing pixels, and a width of the first portion of the first light-absorbing grid is larger than a width of the second portion of the first light-absorbing grid; and the second light-absorbing grid includes a first portion and a second portion, the first portion of the second light-absorbing grid is on the top of the another one of the sensing pixels, and a width of the first portion of the second light-absorbing grid is larger than a width of the second portion of the second light-absorbing grid.

In some embodiments, from the top view, the substrate has an lower-left area between a negative X-axis and a negative Y-axis, the negative X-axis and the negative Y-axis extend from the center of the substrate to a left edge and to a bottom edge of the substrate, respectively, the unit is on the lower-left area, and the first portion of the light-shielding grid is on the right and on the top of the first color filter layer.

In some embodiments, the image sensor further includes a first light-absorbing grid surrounding the second color filter layer of one of the sensing pixels on the left of the PDAF pixel and a second light-absorbing grid surrounding the second color filter layer of another one of the sensing pixels on the bottom of the PDAF pixel in the unit from the top view, in which the first light-absorbing grid includes a first portion and a second portion, the first portion of the first light-absorbing grid is on the left of the one of the sensing pixels, and a width of the first portion of the first light-absorbing grid is larger than a width of the second portion of the first light-absorbing grid; and the second light-absorbing grid includes a first portion and a second portion, the first portion of the second light-absorbing grid is on the bottom of the another one of the sensing pixels, and a width of the first portion of the second light-absorbing grid is larger than a width of the second portion of the second light-absorbing grid.

In some embodiments, from the top view, the substrate has an lower-right area between a positive X-axis and a negative Y-axis, the positive X-axis and the negative Y-axis extend from the center of the substrate to a right edge and to a bottom edge of the substrate, respectively, the unit is on the lower-right area, and the first portion of the light-shielding grid is on the left and on the top of the first color filter layer.

In some embodiments, the image sensor further includes a first light-absorbing grid surrounding the second color filter layer of one of the sensing pixels on the right of the PDAF pixel and a second light-absorbing grid surrounding the second color filter layer of another one of the sensing pixels on the bottom of the PDAF pixel in the unit from the top view, in which the first light-absorbing grid includes a first portion and a second portion, the first portion of the first light-absorbing grid is on the right of the one of the sensing pixels, and a width of the first portion of the first light-absorbing grid is larger than a width of the second portion of the first light-absorbing grid; and the second light-absorbing grid includes a first portion and a second portion, the first portion of the second light-absorbing grid is on the bottom of the another one of the sensing pixels, and a width of the first portion of the second light-absorbing grid is larger than a width of the second portion of the second light-absorbing grid.

In some embodiments, the image sensor further includes light-absorbing grids respectively surrounding the second color filter layers of the sensing pixels in the unit, in which from the top view, the light-absorbing grids includes portions on a side of the PDAF pixel opposite to a side of the PDAF pixel next to the first portion of the light-shielding grid, the width of the first portion of the light-shielding grid and widths of the portions of the light-absorbing grids are equal to $W_0 + (E_0 + ND * E_{MAX})$, $W_0$ is from 50 nm to 150 nm, $E_0$ is from 0 to ¼ times a length of one of the four photodiodes of the PDAF pixel, $E_{MAX}$ is from 0 to ⅓ times the length, ND is equal to $D/D_{MAX}$, D is a distance between the center of the substrate and the center of the unit, and $D_{MAX}$ is a distance between the center of the substrate and an edge of the substrate farthest away from the center of substrate.

In some embodiments, from the top view, a connection line is defined to connect the center of the substrate and a center of the unit, an angle $\phi$ is between the connection line and a positive X-axis of the substrate extending from the center of the substrate to a right edge of the substrate, the first portion of the light-shielding grid includes a first width equal to $W_0 + ((E_0 + ND * E_{MAX}) * |\cos [(\phi/180°*\pi]|)$ and a second width equal to $W_0 + ((E_0 + ND * E_{MAX}) * |\sin [(\phi/180°*\pi]|)$, $W_0$ is from 50 nm to 150 nm, $E_0$ is from 0 to ¼ times a length of one of the four photodiodes of the PDAF pixel, $E_{MAX}$ is from 0 to ⅓ times the length, ND is equal to $D/D_{MAX}$, D is a distance between the center of the substrate and the center of the unit, and $D_{MAX}$ is a distance between the center of the substrate and an edge of the substrate farthest away from the center of substrate.

In some embodiments, the image sensor further includes light-absorbing grids respectively surrounding the second color filter layers of the sensing pixels in the unit, in which from the top view, the light-absorbing grids includes first portions on a side of the PDAF pixel opposite to a side of the PDAF pixel next to the first width of the first portion of the light-shielding grid and second portions on a side of the PDAF pixel opposite to a side of the PDAF pixel next to the second width of the first portion of the light-shielding grid, widths of the first portions of the light-absorbing grids are equal to) $W_0 + ((E_0 + ND * E_{MAX}) * |\cos [(\phi/180°*\pi]|)$, and widths of the second portions of the light-absorbing grids are equal to $W_0 + ((E_0 + ND * E_{MAX}) * |\sin [(\phi/180°*\pi]|)$.

BRIEF DESCRIPTION OF THE DRAWINGS

The present disclosure can be more fully understood by reading the following detailed description of the embodiments, with reference made to the accompanying figures as follows.

DETAILED DESCRIPTION

To make the description of the present disclosure more detailed and complete, the following provides an illustrative description of the aspects of the implementation and the specific embodiments of the present disclosure. The disclosure is not to limit the implementation to only one form. The embodiments of the present disclosure may be combined or substituted with each other for a beneficial circumstance, and other embodiments may be appended without further explanation.

Spatially relative terms, such as above and below, etc., may be used in the present disclosure to describe the relation of one element or feature to another element or feature in the figures. The spatially relative terms are intended to encompass different orientations of the device in use or operation in addition to the orientation depicted in the figures. For example, the device may be oriented otherwise, e.g., 90 degrees or other orientations. Therefore, the spatially relative terms in the present disclosure can be interpreted correspondingly. In addition, in the present disclosure, unless otherwise stated, the same or similar reference numbers in different figures refer to the same or similar elements formed from the same or similar materials by the same or similar methods.

Figure 1:
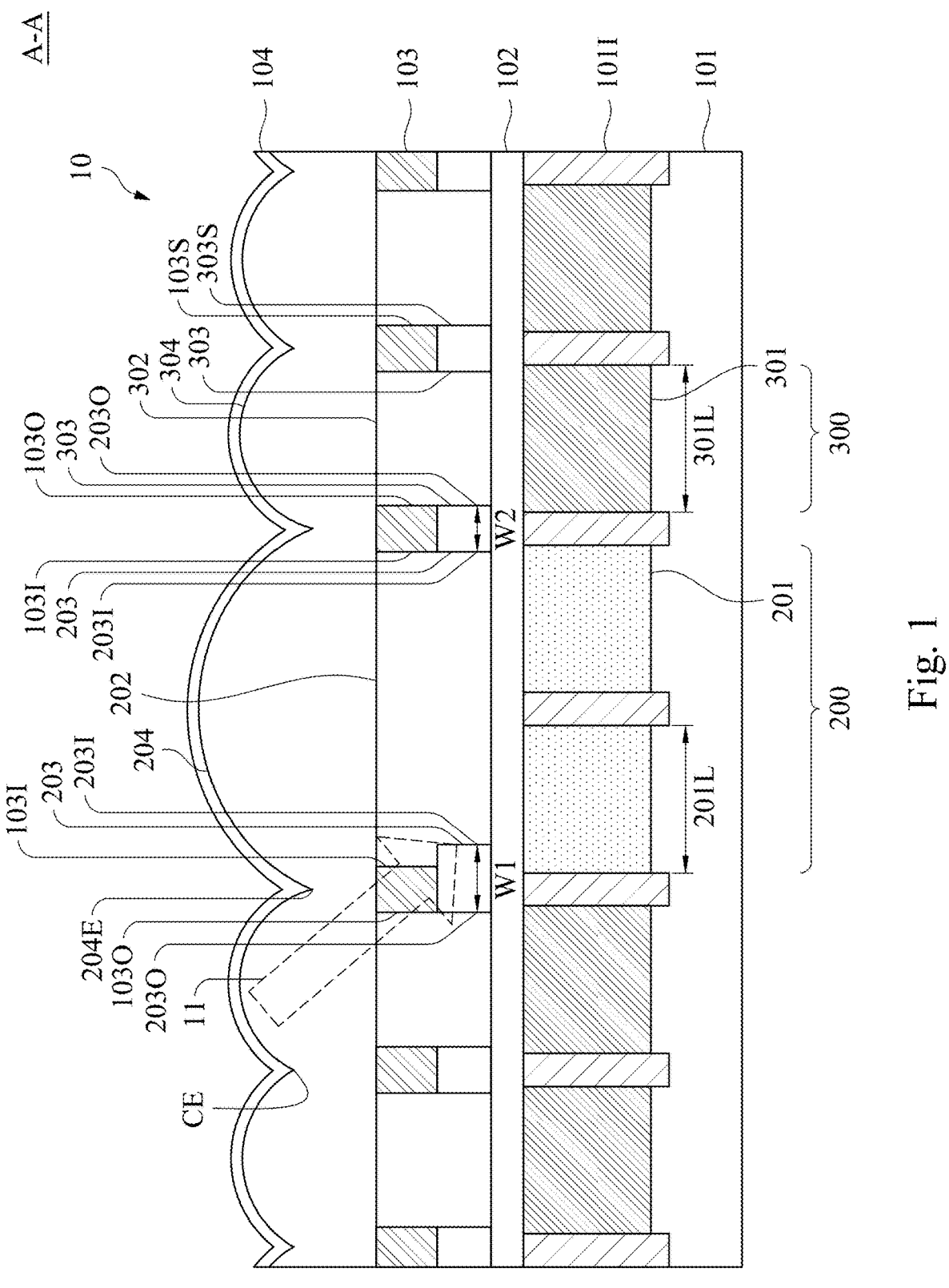
FIGS. 1 and 2 are respectively a cross-sectional view and a perspective top view of the image sensor according to some embodiments of the present disclosure, in which the first portion of the light-shielding grid is wider than the second portion of the light-shielding grid.
Figure 2:
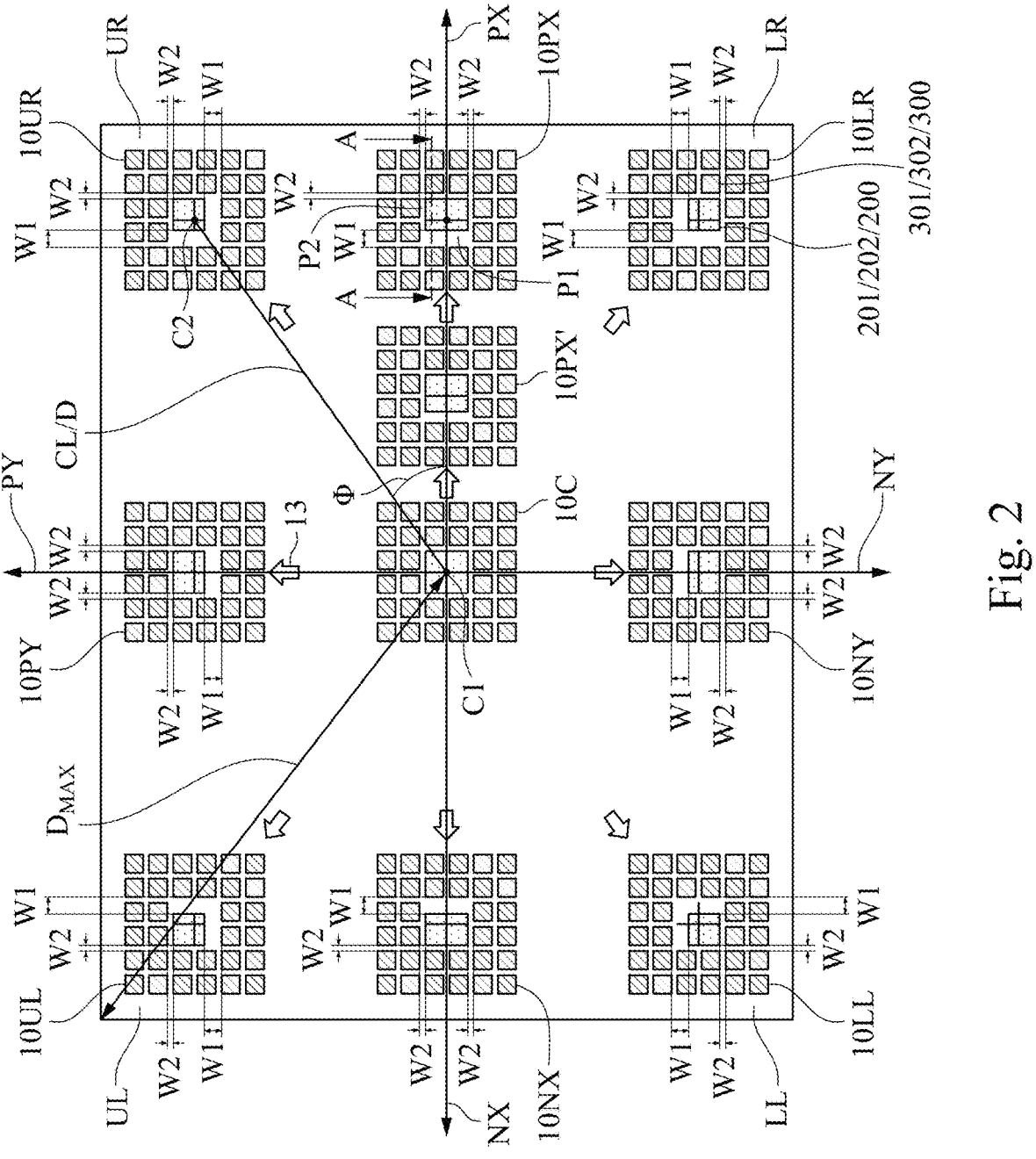
Figure 4:
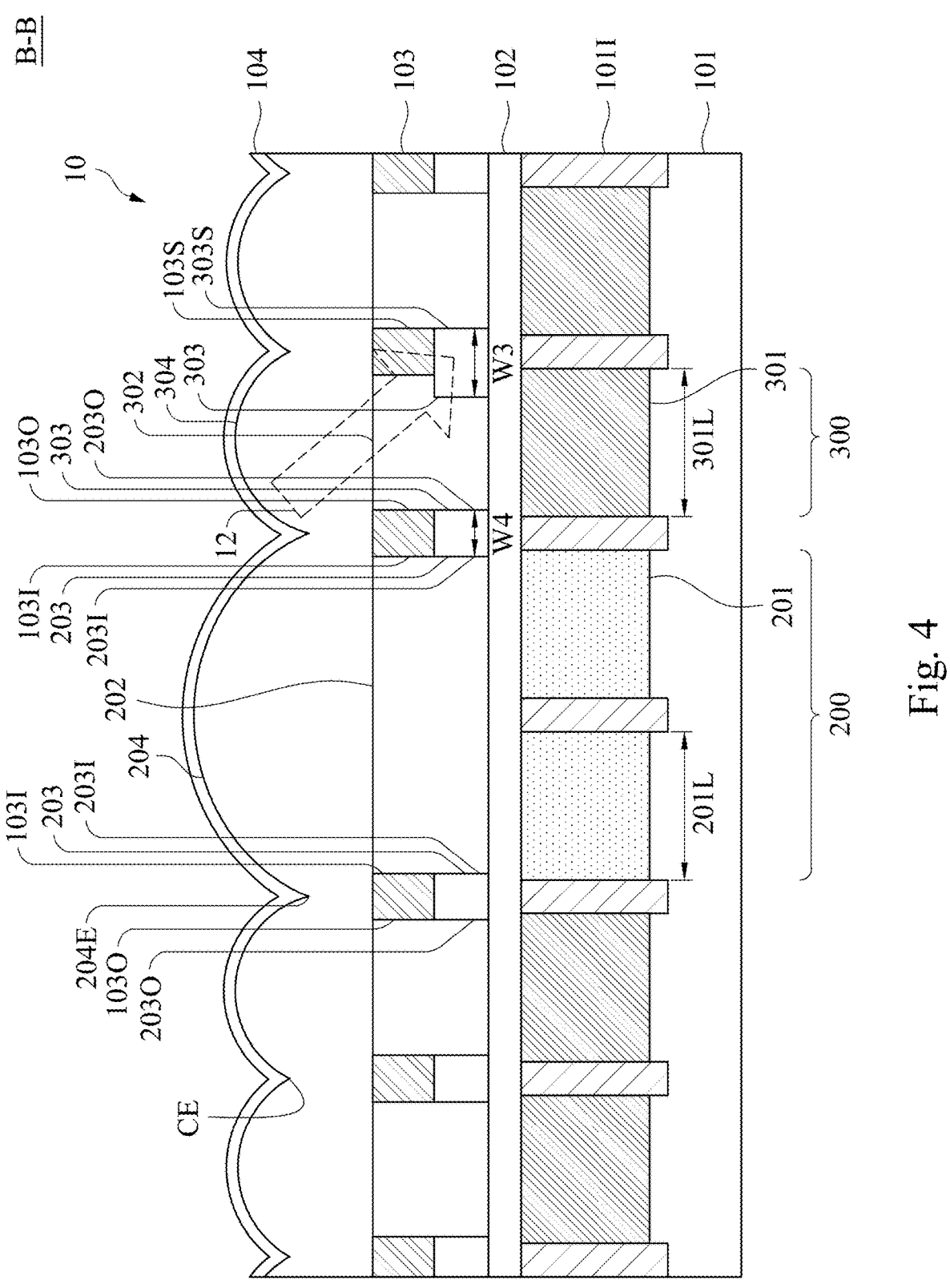
FIGS. 4 to 5 are respectively a cross-sectional view and a perspective top view of the image sensor according to some embodiments of the present disclosure, in which the first portion of the light-absorbing grid is wider than the second portion of the light-absorbing grid.
Figure 5:
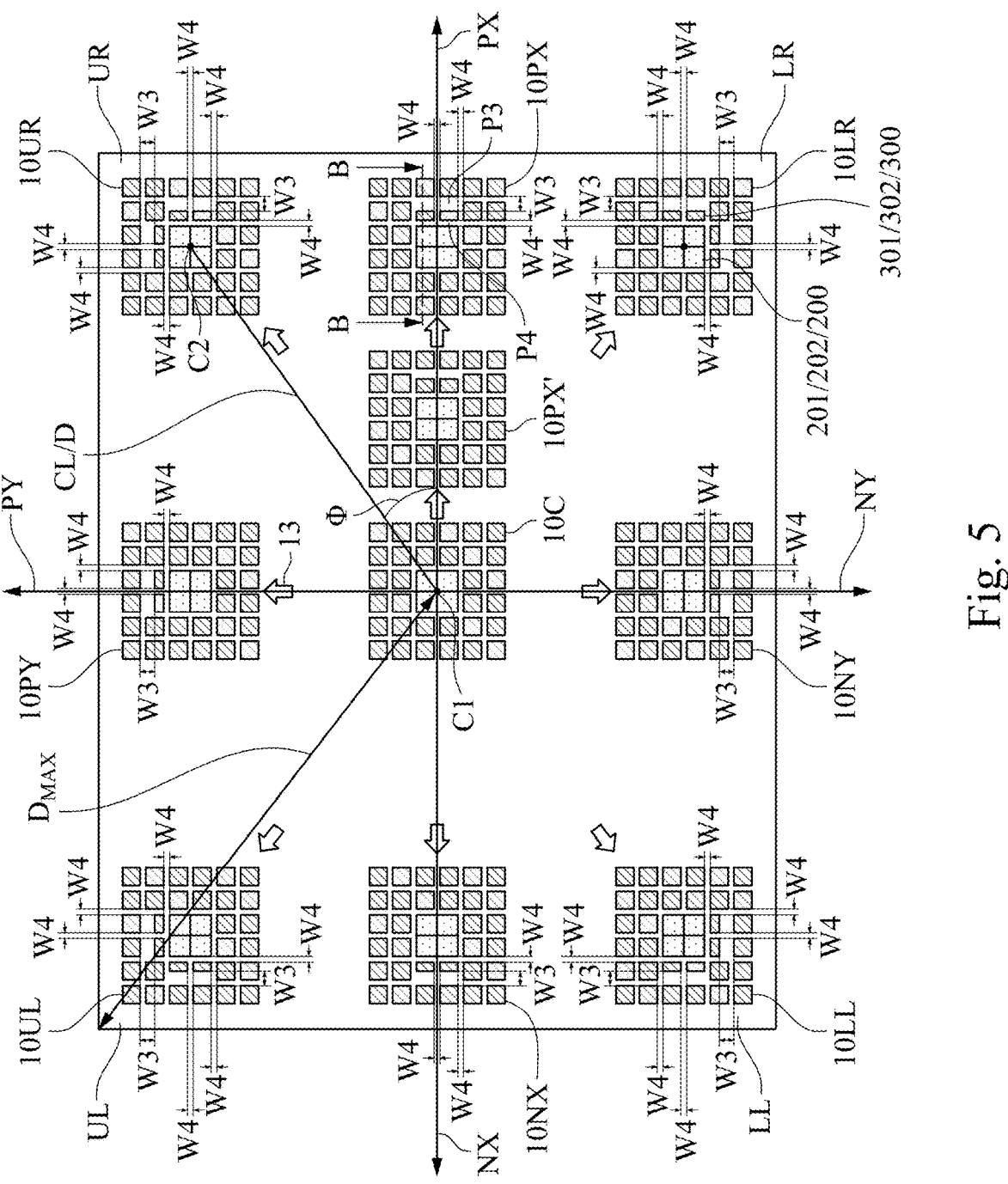
Figure 7:
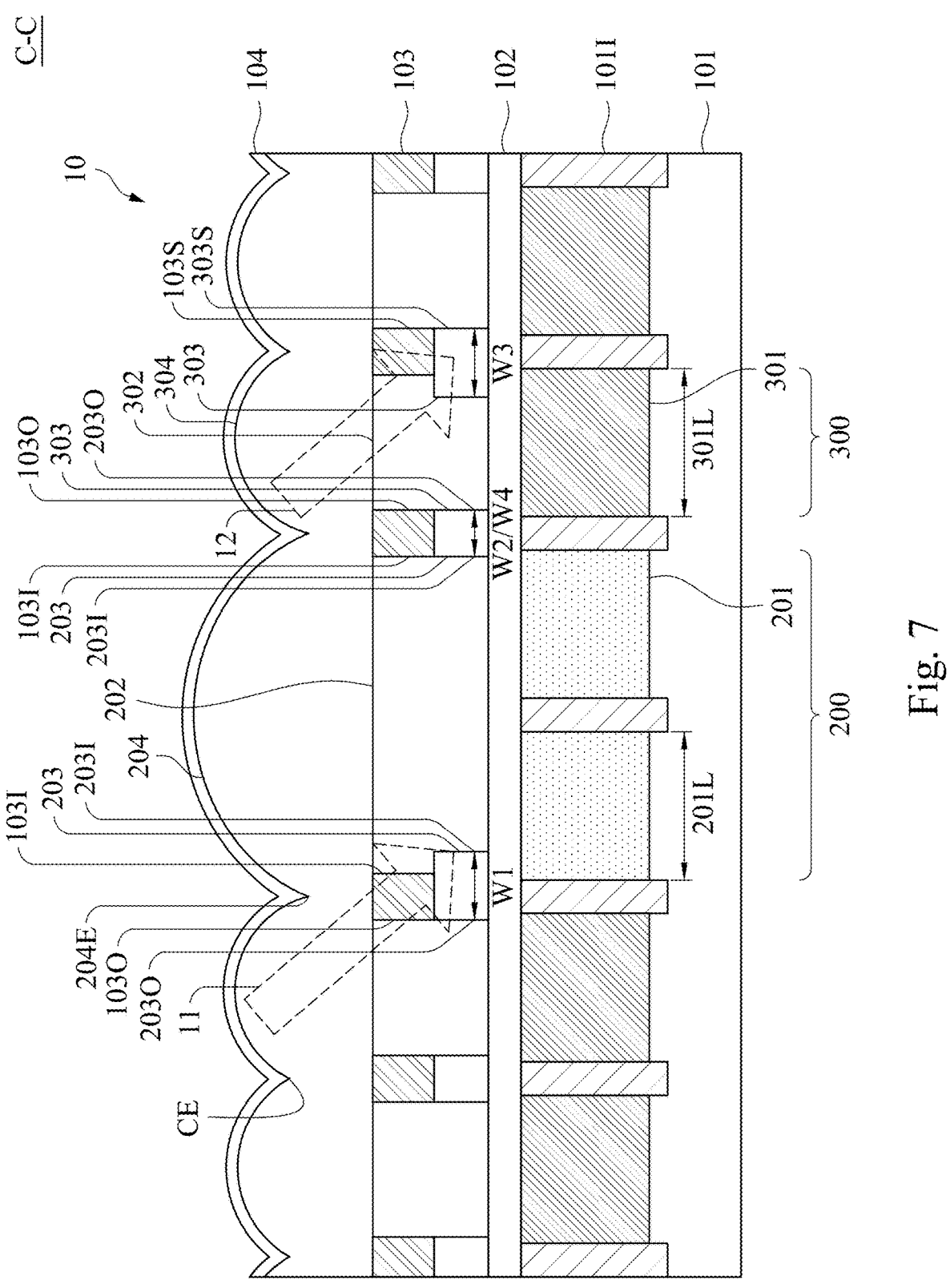
FIGS. 7 to 8 are respectively a cross-sectional view and a perspective top view of the image sensor according to some embodiments of the present disclosure, in which the first portion of the light-shielding grid is wider than the second portion of the light-shielding grid, and the first portion of the light-absorbing grid is wider than the second portion of the light-absorbing grid.
Figure 8:
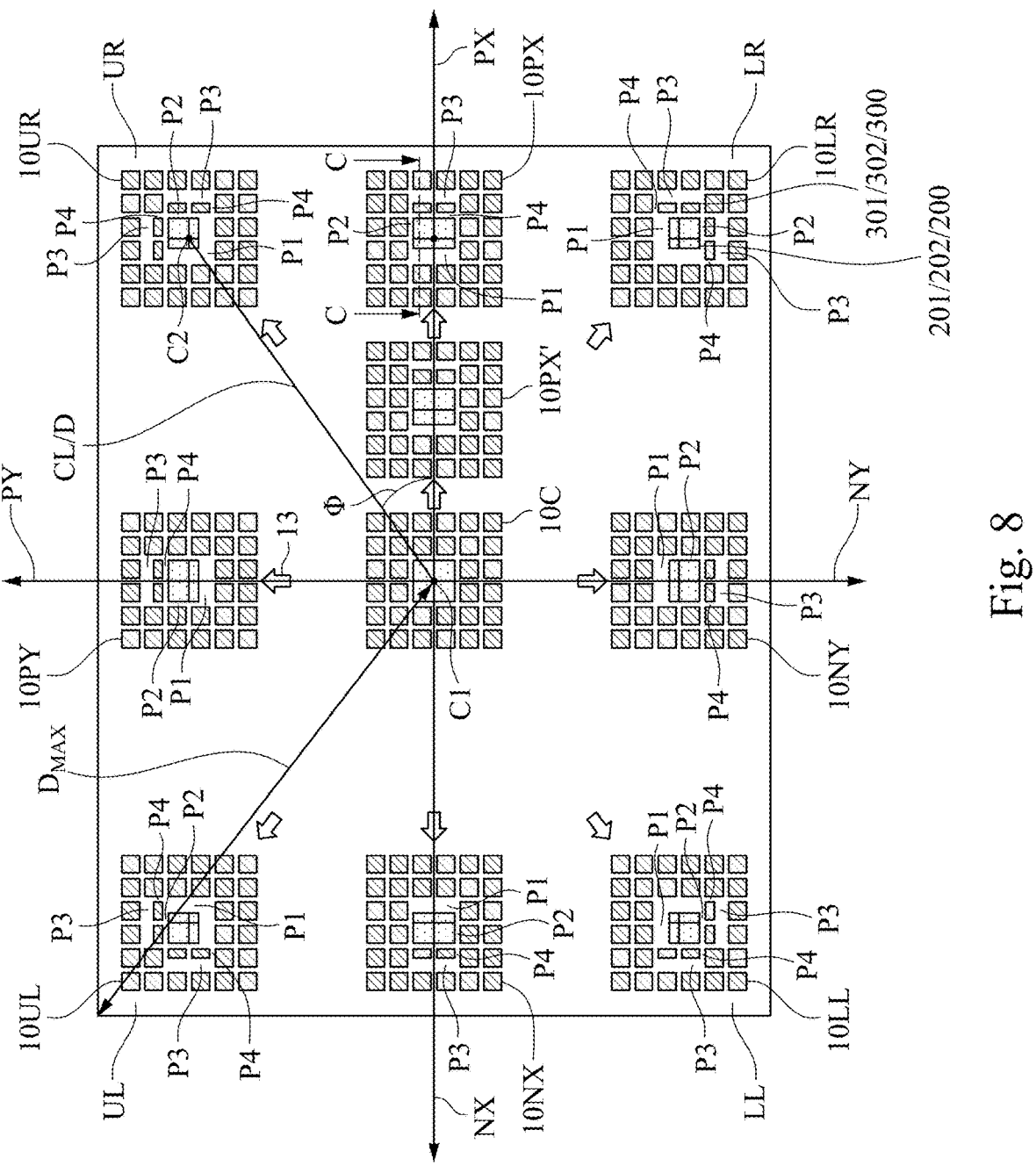

The present disclosure provides an image sensor, as shown in FIGS. 2, 5, and 8, in which FIGS. 1, 4, and 7 are cross-sectional views taken from a line A-A, a line B-B, and a line C-C in the top views of FIGS. 2, 5, and 8, respectively. The image sensor includes at least a unit 10. The unit 10 includes a PDAF pixel 200 and sensing pixels 300 surrounding the PDAF pixel 200 on a substrate 101, in which the PDAF pixel 200 includes four photodiodes 201 and a first color filter layer 202 on the four photodiodes 201, and each of the sensing pixels 300 includes a single photodiode 301 and a second color filter layer 302 on the single photodiode 301. The image sensor of the present disclosure is described in detail with the following embodiments.

In some embodiments, the substrate 101 is a semiconductor substrate and includes any suitable semiconductor material. In some embodiments, the substrate 101 includes an isolation region 1011 and each of the four photodiodes 201 and each of the single photodiode 301 are separated by the isolation region 1011. In some embodiments, the isolation region 1011 includes any suitable electrically insulating material. In some embodiments, the electrically insulating material includes silicon dioxide, SiON, SiCN, the like, or combinations thereof. In some embodiments, an intermediate layer 102 is on the substrate 101, between the four photodiodes 201 and the first color filter layer 202, and between the single photodiodes 301 and the second color filter layer 302. In some embodiments, the intermediate layer 102 is a dielectric layer and includes any suitable dielectric material. In some embodiments, the dielectric material includes $HfO_2$, HfTaO, HfTiO, HfZrO, $Ta_2O_5$, $SiO_2$, $Si_3N_4$, SiON, the like, or combinations thereof.

In some embodiments, the four photodiodes 201 and the single photodiode 301 are embedded in the substrate 101. In some embodiments, the four photodiodes 201 and the single photodiode 301 in the same unit 10 are the same type of photodiodes to sense the same wavelengths of light. In some embodiments, the four photodiodes 201 and the single photodiode 301 are photodiodes sensing red light, green light, blue light, cyan light, magenta light, yellow light, white light, infrared light, or combinations thereof. In some embodiments, the first color filter layer 202 continuously extends on the four photodiodes 201, and the second color filter layer 302 continuously extends on the single photodiode 301. In some embodiments, the four photodiodes 201 are arranged into a 2×2 array on the substrate 101.

In some embodiments, the first color filter layer 202 is configured to filter the wavelengths of light to which the four photodiodes 201 disposed below are sensitive, such that the wavelengths of light to which the four photodiodes 201 are sensitive pass through the first color filter layer 202 to enter the four photodiodes 201, while the wavelengths of light to which the four photodiodes 201 are not sensitive fail to pass through the first color filter layer 202 to enter the four photodiodes 201. In some embodiments, the second color filter layer 302 is configured to filter the wavelengths of light to which the single photodiode 301 disposed below is sensitive, such that the wavelengths of light to which the single photodiode 301 is sensitive pass through the second color filter layer 302 to enter the single photodiode 301, while the wavelengths of light to which the single photodiode 301 are not sensitive fail to pass through the second color filter layer 302 to enter the single photodiode 301. In some embodiments, the first color filter layer 202 and the second color filter layer 302 filter red light, green light, blue light, cyan light, magenta light, yellow light, white light, infrared light, or combinations thereof.

In some embodiments, the unit 10 includes the light-shielding grid 203 surrounding the first color filter layer 202 and light-absorbing grids 303 respectively surrounding the second color filter layers 302. In some embodiments, the light-shielding grid 203 and the light-absorbing grids 303 are a single body made of the same material. The term "light-shielding grid" used in the present disclosure is for a better description of a part of the single body surrounding the first color filter layer 202, and the term "light-absorbing grid" used in the present disclosure is for a better description of a part of the single body surrounding the second color filter layer 302. In some embodiments, the light-shielding grid 203 includes a first portion P1 and a second portion P2 together surrounding the first color filter layer 202, and the first portion P1 that faces a center C1 of the substrate 101 has a width W1 larger than a width W2 of the second portion P2, as shown in FIGS. 1 to 2 and FIGS. 7 to 8. In some embodiments, the light-absorbing grid 303 includes a first portion P3 and a second portion P4 together surrounding the second color filter layer 302, and a width W3 of the first portion P3 is larger than a width W4 of the second portion P4, as shown in FIGS. 4 to 5 and FIGS. 7 to 8. In some embodiments, the sensing pixels 300 having the light-absorbing grids 303 with the first portion P3 wider than the second portion P4 are disposed on a side of the PDAF pixel 200 opposite to a side of the PDAF pixel 200 adjacent to the first portion P1 of the light-shielding grid 203, as shown in FIG. 8. In some embodiments, a projection of the first portion P1 on the substrate 101 has a larger overlapping area with a projection of the four photodiodes 201 on the substrate 101 compared with a projection of the second portion P2 on the substrate 101. In some embodiments, a projection of the first portion P3 on the substrate 101 has a larger overlapping area with a projection of the single photodiode 301 on the substrate 101 compared with a projection of the second portion P4.

The first portion P1 of the light-shielding grid 203 improves the sensitivity of the PDAF pixel 200 by preventing the light 11 (see FIGS. 1 and 7), which has a large angle of incidence and is regarded as the light leaked from the surrounding sensing pixels 300, from entering the PDAF pixel 200. The first portion P3 of the light-absorbing grid 303 decreases the detection cross-talk between the sensing pixels 300 by preventing the light 12 (see FIGS. 4 and 7), which has a large angle of incidence and is regarded as the light leaked from the PDAF pixel 200, from entering the sensing pixels 300 closer to the PDAF pixel 200, so the amount of light received by the sensing pixels 300 closer to the PDAF pixel 200 and the sensing pixels 300 farther away from the PDAF pixel 200 may not be too different to cause the detection cross-talk. In some embodiments, the material of the light-shielding grid 203 and the light-absorbing grids 303 is semi-transparent and absorbs light. In some embodiments, a transmittance of the material of the light-shielding grid 203 and the light-absorbing grids 303 is smaller than 50%. In some embodiments, the material of the light-shielding grid 203 and the light-absorbing grids 303 includes titanium nitride. In some embodiments, a height of the light-shielding grid 203 in a cross-sectional view is from 10 nm to 150 nm, for example, 10 nm, 50 nm, 100 nm, or 150 nm. In some embodiments, a height of the light-absorbing grids 303 in a cross-sectional view is from 10 nm to 150 nm, for example, 10 nm, 50 nm, 100 nm, or 150 nm. In some embodiments, the height of the light-shielding grid 203 and the height of the light-absorbing grids 303 are the same in the cross-sectional view.

In some embodiments, depending on the position of the unit 10 on the substrate 101, the first portion P1 of the light-shielding grid 203 may be arranged on a different side of the first color filter layer 202 to deal with a large angle of the incident light 13 to irradiate different positions of the substrate 101, as shown in FIGS. 2 and 8. In some embodiments, depending on the position of the unit 10 on the substrate 101, the first portion P3 of the light-absorbing grid 303 may be arranged on a different side of the second color filter layer 302 to deal with a large angle of the incident light 13 to irradiate different positions of the substrate 101, as shown in FIGS. 5 and 8. It is noted that the embodiment of FIG. 8 is the combination of the embodiments of FIGS. 2 and 5, so some symbols may not be drawn repeatedly in FIG. 8 for simplicity of the figure. In addition, for a better understanding of the present disclosure, in FIGS. 2, 5, and 8, the substrate 101 is defined to have a positive X-axis PX, a negative X-axis NX, a positive Y-axis PY, and a negative Y-axis NY respectively extending from the center C1 of the substrate 101 to a right edge, a left edge, a top edge, and a bottom edge of the substrate 101, and a connection line CL is defined to connect a center C2 of the unit 10 and the center C1 of the substrate 101, such that an angle $\phi$ can be used to define the position of the unit 10 on the substrate 101.

Except that the position of the unit 10 on the substrate 101 may affect the position of the first portion P1 and/or the first portion P3 on the substrate 101, in some embodiments, the position of the unit 10 on the substrate 101 may also affect the width W1 of the first portion P1 and/or the width W3 of the first portion P3. In some embodiments, the width W1 of the first portion P1 may be $W_0+(E_0+ND*E_{MAX})$, $W_0+((E_0+ND*E_{MAX})*|\cos [(\phi/180°*\pi]|)$, or $W_0+((E_0+ND*E_{MAX})*|\sin [(\phi/180°)*\pi]|)$ depending on the position of the unit 10 on the substrate 101, which will be discussed further in the following disclosure. In some embodiments, when the width W1 of the first portion P1 is in the forgoing range, the sensitivity of the PDAF pixel 200 increases by 0.04 per 10 nm elongation of the width W1 of the first portion P1. In some embodiments, the width W3 of the first portion P3 may be $W_0+(E_0+ND*E_{MAX})$, $W_0+((E_0+ND*E_{MAX})*|\cos [(\phi/180°*\pi]|)$, or $W_0+((E_0+ND*E_{MAX})*|\sin [(\phi/180°*\pi]|)$ depending on the position of the unit 10 on the substrate 101, which will be discussed further in the following disclosure. In some embodiments, when the width W3 of the first portion P3 is in the forgoing range, the detection cross-talk between the sensing pixels 300 decreases by 3.7% per 10 nm elongation of the width W3 of the first portion P3. In some embodiments, the width W2 of the second portion P2 is equal to $W_0$. In some embodiments, the width W4 of the second portion P4 is equal to $W_0$. In some embodiments, $W_0$ is from 50 nm to 150 nm. In some embodiments, $E_0$ is from 0 to ¼ times a length 201L of either one of the four photodiodes 201, and $E_{MAX}$ is from 0 to ⅓ times the length 201L. In some embodiments, each of the four photodiodes 201 has the same length 201L. In some embodiments, the length 201L is from 500 nm to 1000 nm, for example, 500 nm, 600 nm, 700 nm, 800 nm, 900 nm, or 1000 nm. In some embodiments, $E_0$ is from 0 to ¼ times a length 301L of the single photodiode 301, and $E_{MAX}$ is from 0 to ⅓ times the length 301L. In some embodiments, the length 301L is equal to the length 201L. In some embodiments, the length 301L is from 500 nm to 1000 nm, for example, 500 nm, 600 nm, 700 nm, 800 nm, 900 nm, or 1000 nm. In some embodiments, $W_0$ in different units of the same image sensor are the same, $E_0$ in different units of the same image sensor are the same, and $E_{MAX}$ in different units of the same image sensor are the same. In some embodiments, ND is equal to $D/D_{MAX}$, D is a distance (e.g., labeled as the distance D in the figures for the unit 10UR, while not exactly labeled for the units, such as the unit 10PX, and so on, for the simplicity of the figures) between the center C2 of the unit 10 and the center C1 of the substrate 101, and $D_{MAX}$ is a distance (e.g., labeled as the distance $D_{MAX}$ in the figures) between the center C1 of the substrate 101 and an edge of the substrate 101 farthest away from the center C1 of substrate 101. ND scales the distance between the unit 10 and the center C1 of substrate 101 to be in a range of 0 to 1, for example, ND being 0 when the unit 10 is disposed at the center C1 of substrate 101 and being 1 when the unit 10 is disposed on an edge of the substrate 101 farthest away from the center C1 of substrate 101. The angle $\phi$ and ND describe the position of the unit 10 on the substrate 101, and the angle $\phi$ and ND affect the width W1 of the first portion P1 and the width W3 of the first portion P3.

Next, the position of the unit 10 on the substrate 101, the correlated position of the first portion P1 and/or the first portion P3, and the correlated width W1 of the first portion P1 and/or width W3 of the first portion P3 are described in detail below. In some embodiments, the number of the unit 10 on the substrate 101 is not limited, except that in some embodiments, a ratio of a number of the PDAF pixels 200 to a number of the sensing pixels 300 in the image sensor is preferably from 0.50% to 1.65%, for example, 0.50%, 0.80%, 1.00%, 1.25%, or 1.65%, to have enough amount of the PDAF pixels 200 to perform autofocus and enough amount of the sensing pixels 300 to improve the sensing resolution. In some embodiments, the position of the unit 10 on the substrate 101 is not limited, and in some embodiments, the image sensor includes units 10 disposed on different positions of the substrate 101, for example, including the unit 10PX, the unit 10UR, the unit 10PY, the unit 10UL, the unit 10NX, the unit 10LL, the unit 10NY, the unit 10LR, or combinations thereof on the substrate 101. Next, the unit 10PX, the unit 10UR, the unit 10PY, the unit 10UL, the unit 10NX, the unit 10LL, the unit 10NY, and the unit 10LR are described in detail below.

Figure 3:
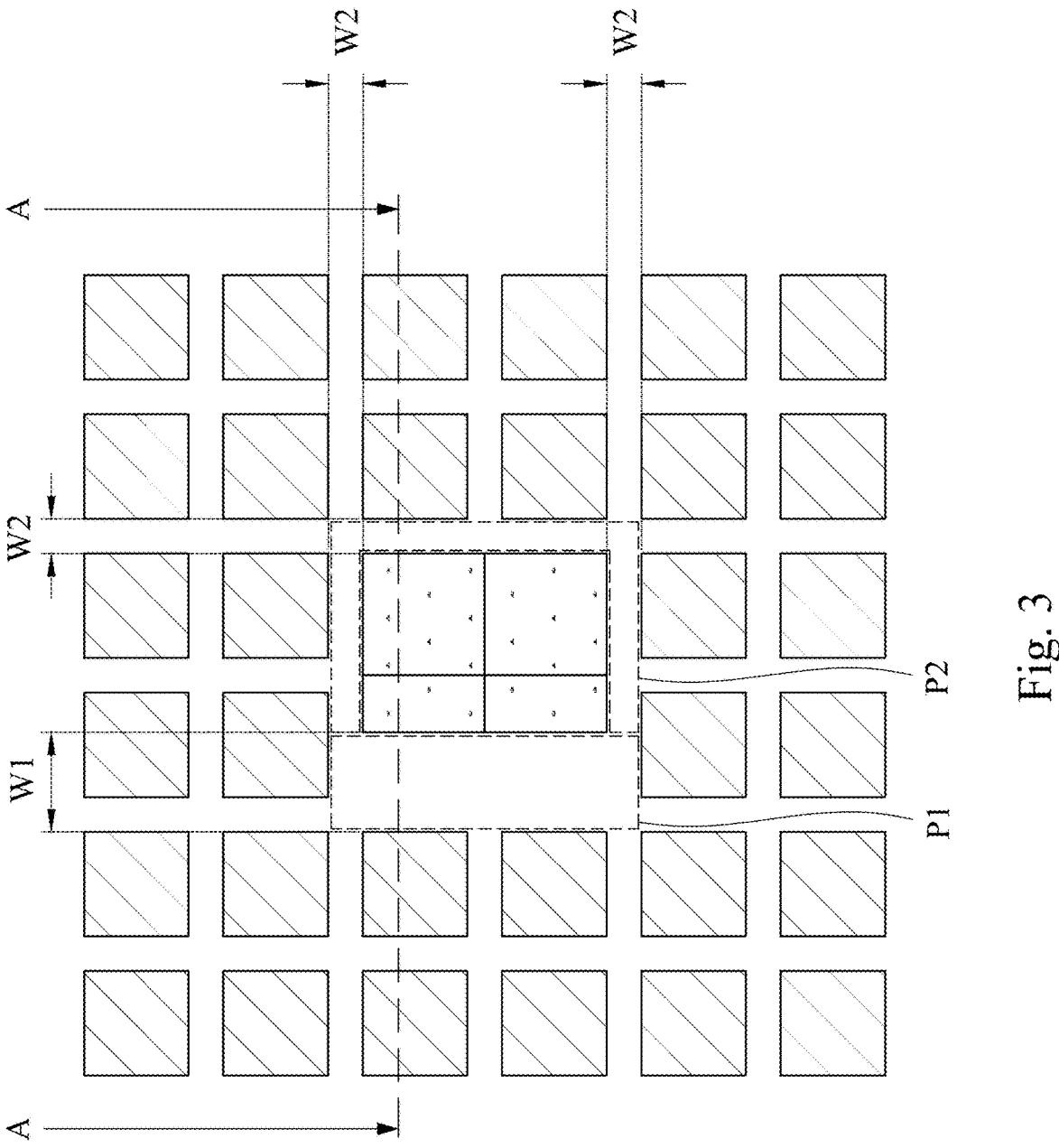
FIG. 3 is an enlarged diagram of a unit shown in the positive X-axis of FIG. 2.
Figure 6:
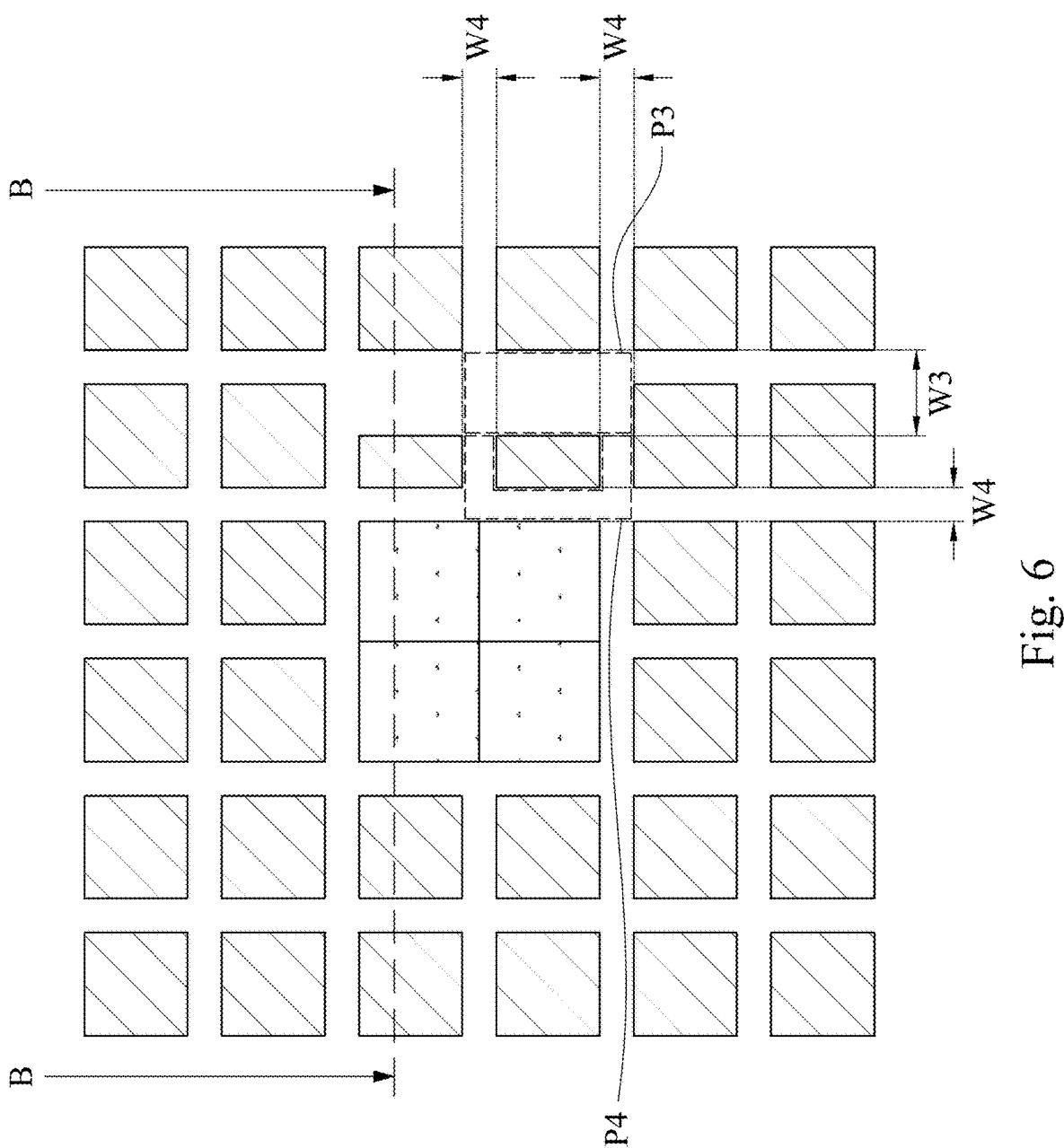
FIG. 6 is an enlarged diagram of a unit shown in the positive X-axis of FIG. 5.
Figure 9:
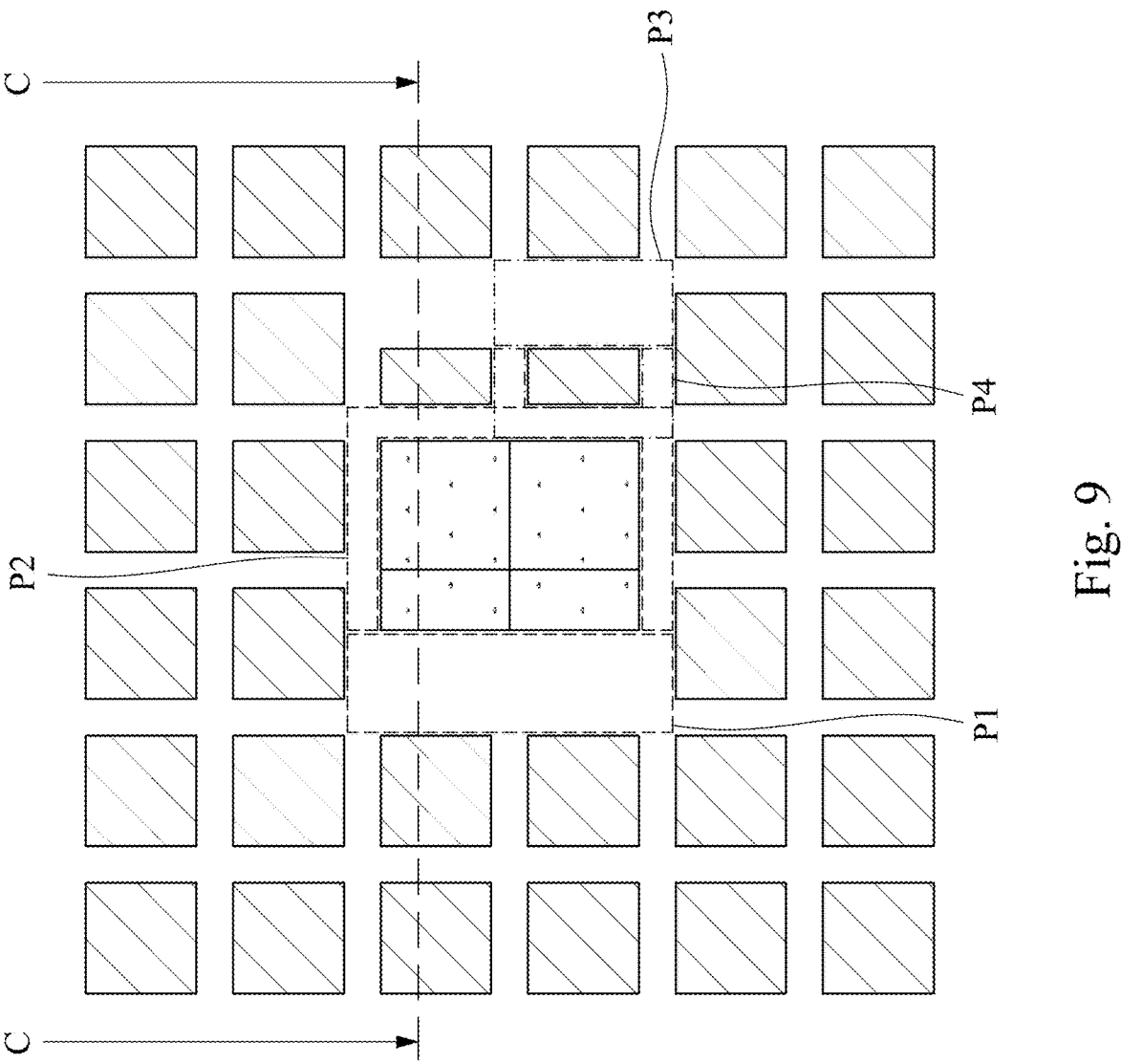
FIG. 9 is an enlarged diagram of a unit shown in the positive X-axis of FIG. 8.

In some embodiments, the center C2 of the unit 10, or labeled as the unit 10PX in the figures, is disposed on the positive X-axis PX to have the angle $\phi$ equal to 0°. In some embodiments of the unit 10PX, as shown in FIGS. 2 and 8, the first portion P1 having the width W1 larger than the width W2 of the second portion P2 in the light-shielding grid 203 is on the left of the first color filter layer 202, and the second portion P2 is on the right, top, and bottom of the first color filter layer 202. In some embodiments, the width W1 is equal to $W_0+(E_0+ND^*E_{MAX})$. In some embodiments of the unit 10PX, as shown in FIGS. 5 and 8, the sensing pixel 300 on the right of the PDAF pixel 200 includes the light-absorbing grid 303 including the first portion P3 and the second portions P4, in which the wider first portion P3 having the width W3 equal to $W_0+(E_0+ND^*E_{MAX})$ is on the right of the second color filter layer 302, and the narrower second portion P4 having the width W4 is on the left, top, and bottom of the second color filter layer 302. In some embodiments of the unit 10PX, as shown in FIGS. 5 and 8, besides the sensing pixel 300 on the right of the PDAF pixel 200, the sensing pixel 300 on the left, top, and bottom of the PDAF pixel 200 includes the light-absorbing grid 303 having a consistent width surrounding the second color filter layer 302, and the consistent width is equal to the width W4. For clarity, FIGS. 3, 6, and 9 are enlarged diagrams of the unit 10PX shown in FIGS. 2, 5, and 8, respectively. Although the enlarged diagrams of the unit 10UR, the unit 10PY, the unit 10UL, the unit 10NX, the unit 10LL, the unit 10NY, and the unit 10LR are not drawn in the present disclosure, one skilled in the art can expect such enlarged diagrams from FIGS. 2, 5, and 8 by the description of the present disclosure.

In some embodiments, the center C2 of the unit 10, or labeled as the unit 10UR in the figures, is disposed on an upper-right area UR of the substrate 101 between the positive X-axis PX and the positive Y-axis PY to have the angle $\phi$ larger than 0° and smaller than 90°. In some embodiments of the unit 10UR, as shown in FIGS. 2 and 8, the first portion P1 having the width W1 larger than the width W2 of the second portion P2 in the light-shielding grid 203 is on the left and bottom of the first color filter layer 202, and the second portion P2 is on the right and top of the first color filter layer 202. In some embodiments, the width W1 on the left of the first color filter layer 202 is equal to $W_0+((E_0+ND^*E_{MAX})^*|) \cos [(\phi/180°^*\pi]|)$, and the width W1 on the bottom of the first color filter layer 202 is equal to $W_0+((E_0+ND^*E_{MAX})^*|\sin [(\phi/180°^*\pi]|)$. In some embodiments of the unit 10UR, as shown in FIGS. 5 and 8, the sensing pixel 300 on the right of the PDAF pixel 200 includes the light-absorbing grid 303 including the first portion P3 and the second portions P4, in which the wider first portion P3 having the width W3 equal to $W_0+((E_0+ND^*E_{MAX})^*|\cos [(\phi/180°^*\pi]|)$ is on the right of the second color filter layer 302, and the narrower second portion P4 having the width W4 is on the left, top, and bottom of the second color filter layer 302. In some embodiments of the unit 10UR, as shown in FIGS. 5 and 8, the sensing pixel 300 on the top of the PDAF pixel 200 includes the light-absorbing grid 303 including the first portion P3 and the second portions P4, in which the wider first portion P3 having the width W3 equal to) $W_0+((E_0+ND^*E_{MAX})^*|\sin [(\phi/180°^*\pi]|)$ is on the top of the second color filter layer 302, and the narrower second portion P4 having the width W4 is on the left, right, and bottom of the second color filter layer 302. In some embodiments of the unit 10UR, as shown in FIGS. 5 and 8, besides the sensing pixel 300 on the right and top of the PDAF pixel 200, the sensing pixel 300 on the left and bottom of the PDAF pixel 200 includes the light-absorbing grid 303 having a consistent width surrounding the second color filter layer 302, and the consistent width is equal to the width W4.

In some embodiments, the center C2 of the unit 10, or labeled as the unit 10PY in the figures, is disposed on the positive Y-axis PY to have the angle $\phi$ equal to 90°. In some embodiments of the unit 10PY, as shown in FIGS. 2 and 8, the first portion P1 having the width W1 larger than the width W2 of the second portion P2 in the light-shielding grid 203 is on the bottom of the first color filter layer 202, and the second portion P2 is on the left, right, and top of the first color filter layer 202. In some embodiments, the width W1 is equal to $W_0+(E_0+ND^*E_{MAX})$. In some embodiments of the unit 10PY, as shown in FIGS. 5 and 8, the sensing pixel 300 on the top of the PDAF pixel 200 includes the light-absorbing grid 303 including the first portion P3 and the second portions P4, in which the wider first portion P3 having the width W3 equal to $W_0+(E_0+ND^*E_{MAX})$ is on the top of the second color filter layer 302, and the narrower second portion P4 having the width W4 is on the left, right, and bottom of the second color filter layer 302. In some embodiments of the unit 10PY, as shown in FIGS. 5 and 8, besides the sensing pixel 300 on the top of the PDAF pixel 200, the sensing pixel 300 on the left, right, and bottom of the PDAF pixel 200 includes the light-absorbing grid 303 having a consistent width surrounding the second color filter layer 302, and the consistent width is equal to the width W4.

In some embodiments, the center C2 of the unit 10, or labeled as the unit 10UL in the figures, is disposed on an upper-left area UL of the substrate 101 between the positive Y-axis PY and the negative X-axis NX to have the angle $\phi$ larger than 90° and smaller than 180°. In some embodiments of the unit 10UL, as shown in FIGS. 2 and 8, the first portion P1 having the width W1 larger than the width W2 of the second portion P2 in the light-shielding grid 203 is on the right and bottom of the first color filter layer 202, and the second portion P2 is on the left and top of the first color filter layer 202. In some embodiments, the width W1 on the right of the first color filter layer 202 is equal to $W_0+((E_0+ND^*E_{MAX})^*|) \cos [(\phi/180°^*\pi]|)$, and the width W1 on the bottom of the first color filter layer 202 is equal to $W_0+((E_0+ND^*E_{MAX})^*|\sin [(\phi/180°^*\pi]|)$. In some embodiments of the unit 10UL, as shown in FIGS. 5 and 8, the sensing pixel 300 on the left of the PDAF pixel 200 includes the light-absorbing grid 303 including the first portion P3 and the second portions P4, in which the wider first portion P3 having the width W3 equal to $W_0+((E_0+ND^*E_{MAX})^*|) \cos [(\phi/180°^*\pi]|)$ is on the left of the second color filter layer 302, and the narrower second portion P4 having the width W4 is on the right, top, and bottom of the second color filter layer 302. In some embodiments of the unit 10UL, as shown in FIGS. 5 and 8, the sensing pixel 300 on the top of the PDAF pixel 200 includes the light-absorbing grid 303 including the first portion P3 and the second portions P4, in which the wider first portion P3 having the width W3 equal to) $W_0+((E_0+ND*E_{MAX})*|\sin[(\phi/180°*\pi]|)$ is on the top of the second color filter layer 302, and the narrower second portion P4 having the width W4 is on the left, right, and bottom of the second color filter layer 302. In some embodiments of the unit 10UL, as shown in FIGS. 5 and 8, besides the sensing pixel 300 on the left and top of the PDAF pixel 200, the sensing pixel 300 on the right and bottom of the PDAF pixel 200 includes the light-absorbing grid 303 having a consistent width surrounding the second color filter layer 302, and the consistent width is equal to the width W4.

In some embodiments, the center C2 of the unit 10, or labeled as the unit 10NX in the figures, is disposed on the negative X-axis NX to have the angle $\phi$ equal to 180°. In some embodiments of the unit 10NX, as shown in FIGS. 2 and 8, the first portion P1 having the width W1 larger than the width W2 of the second portion P2 in the light-shielding grid 203 is on the right of the first color filter layer 202, and the second portion P2 is on the left, top, and bottom of the first color filter layer 202. In some embodiments, the width W1 is equal to $W_0+(E_0+ND*E_{MAX})$. In some embodiments of the unit 10NX, as shown in FIGS. 5 and 8, the sensing pixel 300 on the left of the PDAF pixel 200 includes the light-absorbing grid 303 including the first portion P3 and the second portions P4, in which the wider first portion P3 having the width W3 equal to $W_0+(E_0+ND*E_{MAX})$ is on the left of the second color filter layer 302, and the narrower second portion P4 having the width W4 is on the right, top, and bottom of the second color filter layer 302. In some embodiments of the unit 10NX, as shown in FIGS. 5 and 8, besides the sensing pixel 300 on the left of the PDAF pixel 200, the sensing pixel 300 on the right, top, and bottom of the PDAF pixel 200 includes the light-absorbing grid 303 having a consistent width surrounding the second color filter layer 302, and the consistent width is equal to the width W4.

In some embodiments, the center C2 of the unit 10, or labeled as the unit 10LL in the figures, is disposed on a lower-left area LL of the substrate 101 between the negative X-axis NX and the negative Y-axis NY to have the angle $\phi$ larger than 180° and smaller than 270°. In some embodiments of the unit 10LL, as shown in FIGS. 2 and 8, the first portion P1 having the width W1 larger than the width W2 of the second portion P2 in the light-shielding grid 203 is on the right and top of the first color filter layer 202, and the second portion P2 is on the left and bottom of the first color filter layer 202. In some embodiments, the width W1 on the right of the first color filter layer 202 is equal to $W_0+((E_0+ND*E_{MAX})*|\cos[(\phi/180°*\pi]|)$, and the width W1 on the top of the first color filter layer 202 is equal to $W_0+((E_0+ND*E_{MAX})*|\sin[(\phi/180°*\pi]|)$. In some embodiments of the unit 10LL, as shown in FIGS. 5 and 8, the sensing pixel 300 on the left of the PDAF pixel 200 includes the light-absorbing grid 303 including the first portion P3 and the second portions P4, in which the wider first portion P3 having the width W3 equal to $W_0+((E_0+ND*E_{MAX})*|\cos[(\phi/180°*\pi]|)$ is on the left of the second color filter layer 302, and the narrower second portion P4 having the width W4 is on the right, top, and bottom of the second color filter layer 302. In some embodiments of the unit 10LL, as shown in FIGS. 5 and 8, the sensing pixel 300 on the bottom of the PDAF pixel 200 includes the light-absorbing grid 303 including the first portion P3 and the second portions P4, in which the wider first portion P3 having the width W3 equal to) $W_0+((E_0+ND*E_{MAX})*|\sin[(\phi/180°*\pi]|)$ is on the bottom of the second color filter layer 302, and the narrower second portion P4 having the width W4 is on the left, right, and top of the second color filter layer 302. In some embodiments of the unit 10LL, as shown in FIGS. 5 and 8, besides the sensing pixel 300 on the left and bottom of the PDAF pixel 200, the sensing pixel 300 on the right and top of the PDAF pixel 200 includes the light-absorbing grid 303 having a consistent width surrounding the second color filter layer 302, and the consistent width is equal to the width W4.

In some embodiments, the center C2 of the unit 10, or labeled as the unit 10NY in the figures, is disposed on the negative Y-axis NY to have the angle $\phi$ equal to 270°. In some embodiments of the unit 10NY, as shown in FIGS. 2 and 8, the first portion P1 having the width W1 larger than the width W2 of the second portion P2 in the light-shielding grid 203 is on the top of the first color filter layer 202, and the second portion P2 is on the left, right, and bottom of the first color filter layer 202. In some embodiments, the width W1 is equal to $W_0+(E_0+ND*E_{MAX})$. In some embodiments of the unit 10NY, as shown in FIGS. 5 and 8, the sensing pixel 300 on the bottom of the PDAF pixel 200 includes the light-absorbing grid 303 including the first portion P3 and the second portions P4, in which the wider first portion P3 having the width W3 equal to $W_0+(E_0+ND*E_{MAX})$ is on the bottom of the second color filter layer 302, and the narrower second portion P4 having the width W4 is on the left, top, and top of the second color filter layer 302. In some embodiments of the unit 10NY, as shown in FIGS. 5 and 8, besides the sensing pixel 300 on the bottom of the PDAF pixel 200, the sensing pixel 300 on the left, top, and top of the PDAF pixel 200 includes the light-absorbing grid 303 having a consistent width surrounding the second color filter layer 302, and the consistent width is equal to the width W4.

In some embodiments, the center C2 of the unit 10, or labeled as the unit 10LR in the figures, is disposed on a lower-right area LR of the substrate 101 between the positive X-axis PX and the negative Y-axis NY to have the angle $\phi$ larger than 270° and smaller than 360°. In some embodiments of the unit 10LR, as shown in FIGS. 2 and 8, the first portion P1 having the width W1 larger than the width W2 of the second portion P2 in the light-shielding grid 203 is on the left and top of the first color filter layer 202, and the second portion P2 is on the right and bottom of the first color filter layer 202. In some embodiments, the width W1 on the left of the first color filter layer 202 is equal to $W_0+((E_0+ND*E_{MAX})*|\cos[(\phi/180°*\pi]|)$, and the width W1 on the top of the first color filter layer 202 is equal to $W_0+((E_0+ND*E_{MAX})*|\sin[(\phi/180°*\pi]|)$. In some embodiments of the unit 10LR, as shown in FIGS. 5 and 8, the sensing pixel 300 on the right of the PDAF pixel 200 includes the light-absorbing grid 303 including the first portion P3 and the second portions P4, in which the wider first portion P3 having the width W3 equal to $W_0+((E_0+ND*E_{MAX})*|\cos[(\phi/180°*\pi]|)$ is on the right of the second color filter layer 302, and the narrower second portion P4 having the width W4 is on the left, top, and bottom of the second color filter layer 302. In some embodiments of the unit 10LR, as shown in FIGS. 5 and 8, the sensing pixel 300 on the bottom of the PDAF pixel 200 includes the light-absorbing grid 303 including the first portion P3 and the second portions P4, in which the wider first portion P3 having the width W3 equal to $W_0+((E_0+ND*E_{MAX}))*|\sin[(\phi/180°*\pi]|)$ is on the bottom of the second color filter layer 302, and the narrower second portion P4 having the width W4 is on the left, right, and top of the second color filter layer 302. In some embodiments of the unit 10LR, as shown in FIGS. 5 and 8, besides the sensing pixel 300 on the right and bottom of the PDAF pixel 200, the sensing pixel 300 on the left and top of the PDAF pixel 200 includes the light-absorbing grid 303 having a consistent width surrounding the second color filter layer 302, and the consistent width is equal to the width W4.

In some embodiments, the first portion P1 of the light-shielding grid 203 of the unit farther away from the center C1 of the substrate 101 is wider than the first portion P1 of the light-shielding grid 203 of the unit closer to the center C1 of the substrate 101, in which the first portion P1 in the unit 10PX wider than the first portion P1 in the unit 10PX' are drawn in the figures as examples. In some embodiments, the first portion P3 of the light-absorbing grid 303 of the unit farther away from the center C1 of the substrate 101 is wider than the first portion P3 of the light-absorbing grid 303 of the unit closer to the center C1 of the substrate 101, in which the first portion P3 in the unit 10PX wider than the first portion P3 in the unit 10PX' are drawn in the figures as examples. In some embodiments, the image sensor includes the unit 10, or labeled as the unit 10C in the figures, having the center C2 disposed at the center C1 of the substrate 101, the light-shielding grid 203 of the unit 10C has a consistent width equal to the width W2 surrounding the first color filter layer 202, and the light-absorbing grid 303 of the unit 10C has a consistent width equal to the width W4 surrounding the second color filter layer 302.

In some embodiments, a transparent grid 103 is on the light-shielding grid 203 and the light-absorbing grids 303. The transparent grid 103, the light-shielding grid 203, and the light-absorbing grids 303 separate the first color filter layer 202 from the second color filter layers 302 and separate the second color filter layers 302 from each other. In some embodiments, the first color filter layer 202 and each of the second color filter layers 302 are surrounded by the transparent grid 103. In some embodiments, a part of the transparent grid 103 surrounding the first color filter layer 202 includes an inner surrounding side 1031 and an outer surrounding side 1030, the light-shielding grid 203 surrounding the first color filter layer 202 includes an inner surrounding side 2031 and an outer surrounding side 2030, and the outer surrounding side 1030 is aligned with the outer surrounding side 2030. In some embodiments, the transparent grid 103 includes a side 103S aligned with a side 303S of the light-absorbing grid 303, in which the side 103S and the side 303S are on a side of the second color filter layer 302 opposite to a side of the second color filter layer 302 closer to the first color filter layer 202, and the side 103S and the side 303S are farther sides of the transparent grid 103 and the light-absorbing grid 303 surrounding the transparent grid 103 and the light-absorbing grid 303 compared to nearer sides of the transparent grid 103 and the light-absorbing grid 303 surrounding the transparent grid 103 and the light-absorbing grid 303. In some embodiments, a side of the first portion P1 of the light-shielding grid 203 is aligned with a side of the transparent grid 103, and another side of the first portion P1 of the light-shielding grid 203 extends inward to the center C2 of the PDAF pixel 200. In some embodiments, a side of the first portion P3 of the light-absorbing grid 303 is aligned with a side of the transparent grid 103, and another side of the first portion P3 of the light-absorbing grid 303 extends inward to the center of the sensing pixel 300. In some embodiments, a width of the transparent grid 103 in a cross-sectional view is equal to the width W2 or the width W4. In some embodiments, a refractive index of the transparent grid 103 is smaller than refractive indexes of the light-shielding grid 203 and the light-absorbing grids 303. In some embodiments, the transparent grid 103 includes a dielectric material.

In some embodiments, a first microlens 204 is on the first color filter layer 202, and second microlenses 304 are respectively on the second color filter layers 302. In some embodiments, the first microlens 204 and the second microlenses 304 are a single body made of the same material. In some embodiments, the first microlens 204 has a convex surface protruding away from the first color filter layer 202, and the second microlenses 304 have convex surfaces respectively protruding away from the second color filter layers 302. In some embodiments, from a cross-sectional view, an edge 204E of the first microlens 204 connecting the second microlenses 304 is lower than connecting edges CE between the second microlenses 304. When the edge 204E is lower than the connecting edges CE, a radius of curvature of the first microlens 204 is reduced to increase the sensing sensitivity of the PDFA pixel 200. In some embodiments, an anti-reflective coating layer 104 is on the first microlens 204 and the second microlenses 304.

The present disclosure also provides a method of forming the image sensor described above. The method includes the following operations.

Figure 10:
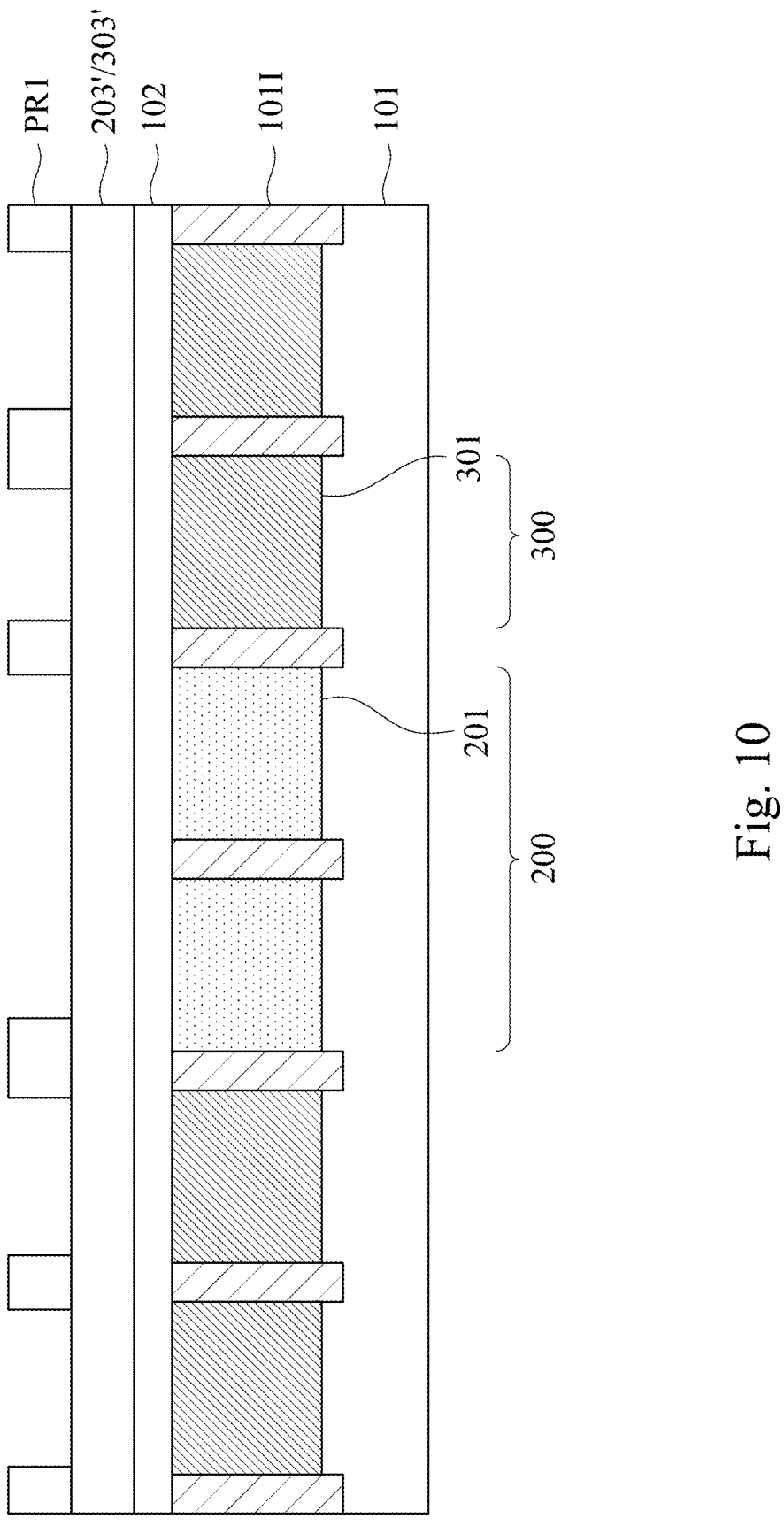
FIGS. 10 to 13 are cross-sectional views of forming the image sensor according to some embodiments of the present disclosure.

In FIG. 10, the substrate 101 having the four photodiodes 201 and the single photodiode 301 embedded in the substrate 101 is received. The intermediate layer 102 may be formed on the substrate 101 by any suitable method, for example, a chemical vapor deposition or a physical vapor deposition. A material (label as the material 203' or the material 303' in the figures) of the light-shielding grid 203 and the light-absorbing grids 303 is formed on the substrate 101 by any suitable method, for example, a chemical vapor deposition or a physical vapor deposition. A hard mask layer PR1 having openings is formed on the material of the light-shielding grid 203 and the light-absorbing grids 303, the positions of the openings are respectively located above the four photodiodes 201 and the single photodiode 301 to define the positions of the first color filter layer 202 and the second color filter layer 302 formed in the following operation, and the hard mask layer PR1 is located above the positions where the light-shielding grid 203 and the light-absorbing grids 303 will be formed. The position and the widths of the hard mask layer PR1 are substantially the same as the positions and the widths of the light-shielding grid 203 and the light-absorbing grids 303, which can be referred to in detail from the above description. In some embodiments, the hard mask layer PR1 is formed by any suitable method, for example, a chemical vapor deposition or a physical vapor deposition. In some embodiments, a height of the hard mask layer PR1 is from 300 nm to 400 nm in a cross-sectional view.

Figure 11:
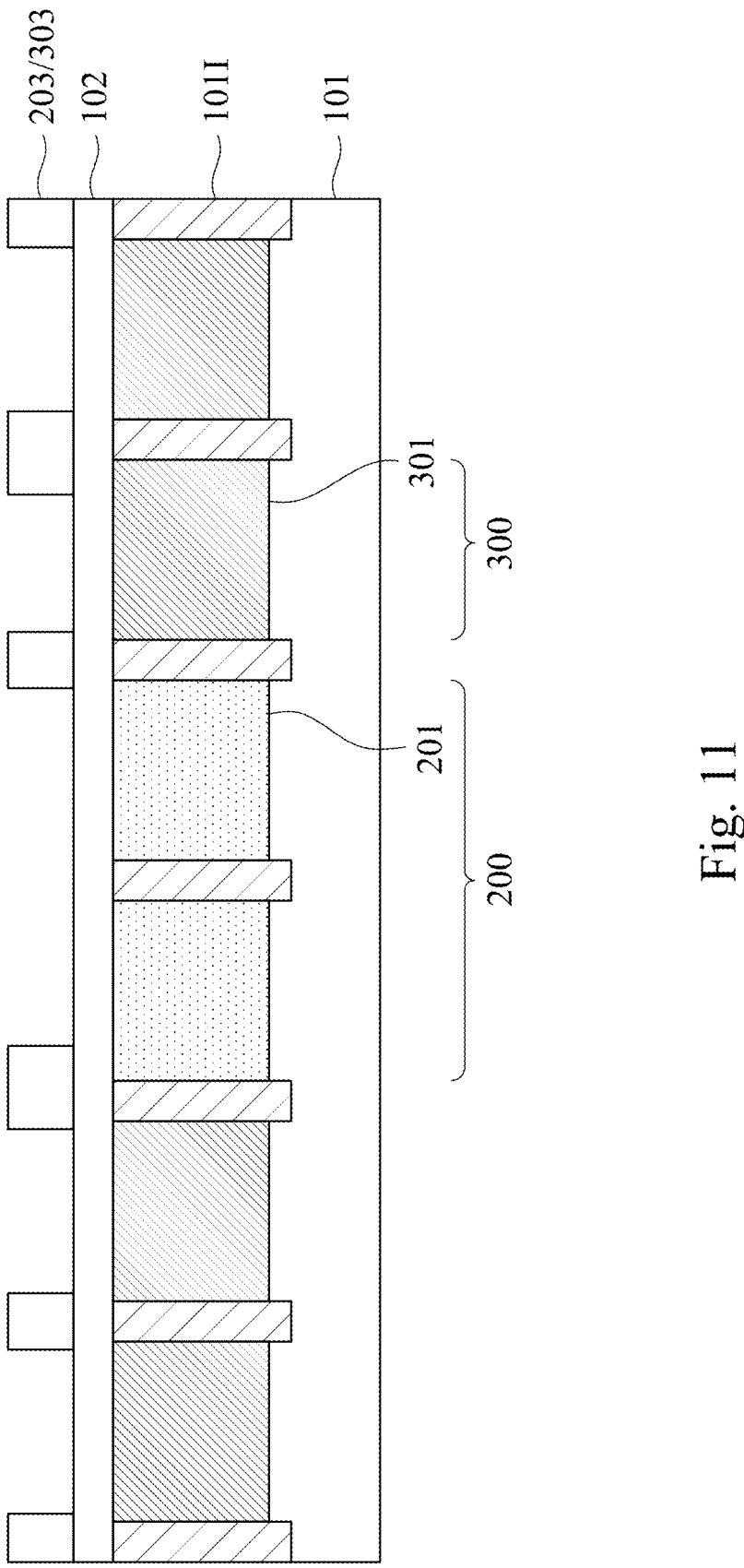

In FIG. 11, portions of the material of the light-shielding grid 203 and the light-absorbing grids 303 exposed by the openings of the hard mask layer PR1 are etched to form the light-shielding grid 203 and the light-absorbing grids 303. In some embodiments, the portions are etched by a dry etching method including an etching gas based on chlorine.

Figure 12:
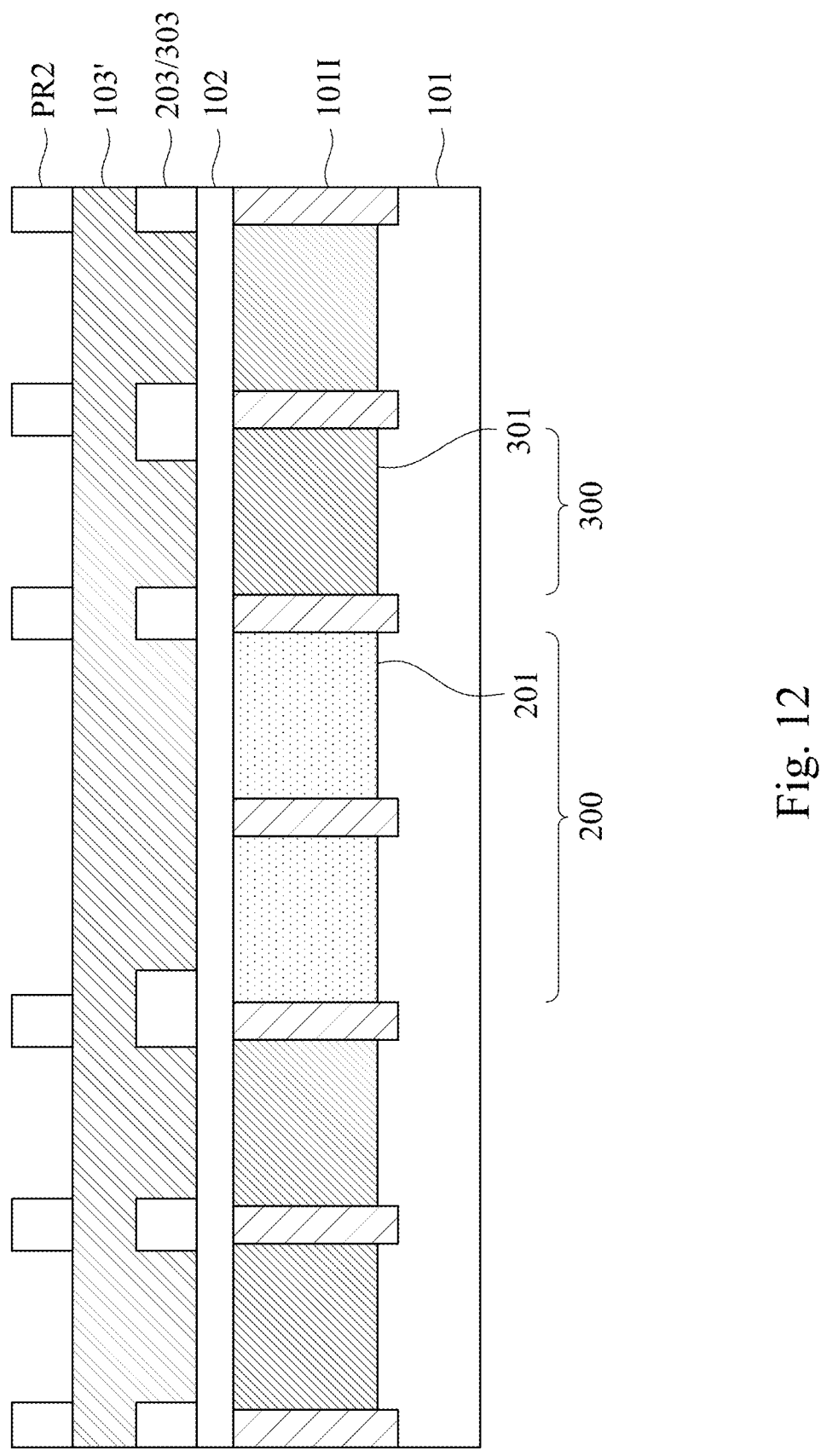

In FIG. 12, a material 103' of the transparent grid 103 is formed on the substrate 101, the light-shielding grid 203 and the light-absorbing grids 303 by any suitable method, for example, a chemical vapor deposition or a physical vapor deposition. A hard mask layer PR2 having openings is formed on the material 103' of the transparent grid 103, the positions of the openings are respectively located above the four photodiodes 201 and the single photodiode 301 to define the positions of the first color filter layer 202 and the second color filter layer 302 formed in the following operation, and the hard mask layer PR2 is located above the positions where the transparent grid 103 will be formed. In some embodiments, the hard mask layer PR2 is formed by any suitable method, for example, a chemical vapor deposition or a physical vapor deposition. In some embodiments, a height of the hard mask layer PR2 is from 400 nm to 500 nm in a cross-sectional view.

Figure 13:
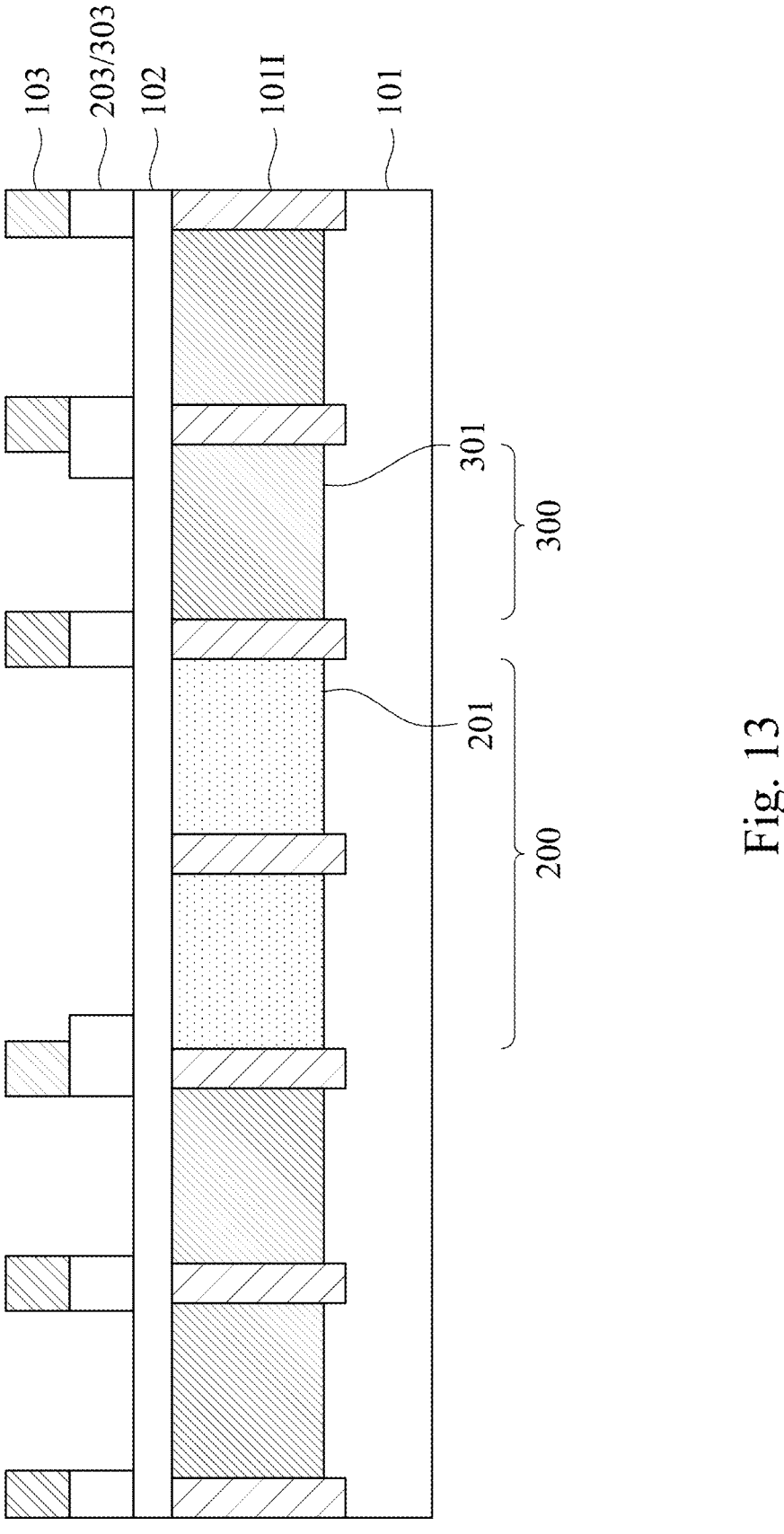

In FIG. 13, portions of the material 103' of the transparent grid 103 exposed by the openings of the hard mask layer PR2 are etched to form the transparent grid 103. In some embodiments, the portions are etched by a dry etching method including an etching gas based on fluorine. In some embodiments, after forming the transparent grid 103, the first color filter layer 202 and the second color filter layer 302, as shown in FIG. 1, 4, or 7, are formed on the substrate 101 and respectively above the four photodiodes 201 and the single photodiode 301. In some embodiments, after forming the first color filter layer 202 and the second color filter layer 302, the first microlens 204 and the second microlens 304, as shown in FIG. 1, 4, or 7, are respectively formed on the first color filter layer 202 are the second color filter layer 302. In some embodiments, after forming the first microlens 204 and the second microlens 304, the anti-reflective coating layer 104, as shown in FIG. 1, 4, or 7, is formed on the first microlens 204 and the second microlens 304.

The image sensor of the present disclosure has improved sensitivity in the PDAF pixel 200 and the detection cross-talk between the sensing pixels 300 is reduced. In some embodiments, the image sensor of the present disclosure can be applied as a mobile, an automotive, or a surveillance sensor.

Although the present disclosure has been described in considerable detail with reference to certain embodiments thereof, other embodiments are possible.

Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. An image sensor, comprising:
   a unit, comprising:
      a phase detection auto focus (PDAF) pixel on a substrate, wherein the PDAF pixel comprises four photodiodes and a first color filter layer on the four photodiodes;
   sensing pixels on the substrate and surrounding the PDAF pixel, wherein each of the sensing pixels comprises a single photodiode and a second color filter layer on the single photodiode; and
      a light-shielding grid surrounding the first color filter layer, wherein the light-shielding grid comprises a first portion and a second portion together continuously surrounding four sides of the first color filter layer, the first portion is closer to a center of the substrate than the second portion, and a width of the first portion is larger than a width of the second portion from a top view.

2. The image sensor of claim 1, wherein from the top view, the substrate has a positive X-axis extending from the center of the substrate to a right edge of the substrate, the unit is on the positive X-axis, and the first portion of the light-shielding grid is on the left of the first color filter layer.

3. The image sensor of claim 2, further comprising a light-absorbing grid surrounding the second color filter layer of one of the sensing pixels on the right of the PDAF pixel in the unit from the top view, wherein the light-absorbing grid comprises a first portion and a second portion, the first portion of the light-absorbing grid is on the right of the one of the sensing pixels, and a width of the first portion of the light-absorbing grid is larger than a width of the second portion of the light-absorbing grid.

4. The image sensor of claim 1, wherein from the top view, the substrate has a negative X-axis extending from the center of the substrate to a left edge of the substrate, the unit is on the negative X-axis, and the first portion of the light-shielding grid is on the right of the first color filter layer.

5. The image sensor of claim 4, further comprising a light-absorbing grid surrounding the second color filter layer of one of the sensing pixels on the left of the PDAF pixel in the unit from the top view, wherein the light-absorbing grid comprises a first portion and a second portion, the first portion of the light-absorbing grid is on the left of the one of the sensing pixels, and a width of the first portion of the light-absorbing grid is larger than a width of the second portion of the light-absorbing grid.

6. The image sensor of claim 1, wherein from the top view, the substrate has a positive Y-axis extending from the center of the substrate to a top edge of the substrate, the unit is on the positive Y-axis, and the first portion of the light-shielding grid is on the bottom of the first color filter layer.

7. The image sensor of claim 6, further comprising a light-absorbing grid surrounding the second color filter layer of one of the sensing pixels on the top of the PDAF pixel in the unit from the top view, wherein the light-absorbing grid comprises a first portion and a second portion, the first portion of the light-absorbing grid is on the top of the one of the sensing pixels, and a width of the first portion of the light-absorbing grid is larger than a width of the second portion of the light-absorbing grid.

8. The image sensor of claim 1, wherein from the top view, the substrate has a negative Y-axis extending from the center of the substrate to a bottom edge of the substrate, the unit is on the negative Y-axis, and the first portion of the light-shielding grid is on the top of the first color filter layer.

9. The image sensor of claim 8, further comprising a light-absorbing grid surrounding the second color filter layer of one of the sensing pixels on the bottom of the PDAF pixel in the unit from the top view, wherein the light-absorbing grid comprises a first portion and a second portion, the first portion of the light-absorbing grid is on the bottom of the one of the sensing pixels, and a width of the first portion of the light-absorbing grid is larger than a width of the second portion of the light-absorbing grid.

10. The image sensor of claim 1, wherein from the top view, the substrate has an upper-right area between a positive X-axis and a positive Y-axis, the positive X-axis and the positive Y-axis extend from the center of the substrate to a right edge and to a top edge of the substrate, respectively, the unit is on the upper-right area, and the first portion of the light-shielding grid is on the left and on the bottom of the first color filter layer.

11. The image sensor of claim 10, further comprising a first light-absorbing grid surrounding the second color filter layer of one of the sensing pixels on the right of the PDAF pixel and a second light-absorbing grid surrounding the second color filter layer of another one of the sensing pixels on the top of the PDAF pixel in the unit from the top view, wherein:
   the first light-absorbing grid comprises a first portion and a second portion, the first portion of the first light-absorbing grid is on the right of the one of the sensing pixels, and a width of the first portion of the first light-absorbing grid is larger than a width of the second portion of the first light-absorbing grid; and the second light-absorbing grid comprises a first portion and a second portion, the first portion of the second light-absorbing grid is on the top of the another one of the sensing pixels, and a width of the first portion of the second light-absorbing grid is larger than a width of the second portion of the second light-absorbing grid.

12. The image sensor of claim 1, wherein from the top view, the substrate has an upper-left area between a negative X-axis and a positive Y-axis, the negative X-axis and the positive Y-axis extend from the center of the substrate to a left edge and to a top edge of the substrate, respectively, the unit is on the upper-left area, and the first portion of the light-shielding grid is on the right and on the bottom of the first color filter layer.

13. The image sensor of claim 12, further comprising a first light-absorbing grid surrounding the second color filter layer of one of the sensing pixels on the left of the PDAF pixel and a second light-absorbing grid surrounding the second color filter layer of another one of the sensing pixels on the top of the PDAF pixel in the unit from the top view, wherein:

the first light-absorbing grid comprises a first portion and a second portion, the first portion of the first light-absorbing grid is on the left of the one of the sensing pixels, and a width of the first portion of the first light-absorbing grid is larger than a width of the second portion of the first light-absorbing grid; and the second light-absorbing grid comprises a first portion and a second portion, the first portion of the second light-absorbing grid is on the top of the another one of the sensing pixels, and a width of the first portion of the second light-absorbing grid is larger than a width of the second portion of the second light-absorbing grid.

14. The image sensor of claim 1, wherein from the top view, the substrate has an lower-left area between a negative X-axis and a negative Y-axis, the negative X-axis and the negative Y-axis extend from the center of the substrate to a left edge and to a bottom edge of the substrate, respectively, the unit is on the lower-left area, and the first portion of the light-shielding grid is on the right and on the top of the first color filter layer.

15. The image sensor of claim 14, further comprising a first light-absorbing grid surrounding the second color filter layer of one of the sensing pixels on the left of the PDAF pixel and a second light-absorbing grid surrounding the second color filter layer of another one of the sensing pixels on the bottom of the PDAF pixel in the unit from the top view, wherein:

the first light-absorbing grid comprises a first portion and a second portion, the first portion of the first light-absorbing grid is on the left of the one of the sensing pixels, and a width of the first portion of the first light-absorbing grid is larger than a width of the second portion of the first light-absorbing grid; and the second light-absorbing grid comprises a first portion and a second portion, the first portion of the second light-absorbing grid is on the bottom of the another one of the sensing pixels, and a width of the first portion of the second light-absorbing grid is larger than a width of the second portion of the second light-absorbing grid.

16. The image sensor of claim 1, wherein from the top view, the substrate has an lower-right area between a positive X-axis and a negative Y-axis, the positive X-axis and the negative Y-axis extend from the center of the substrate to a right edge and to a bottom edge of the substrate, respectively, the unit is on the lower-right area, and the first portion of the light-shielding grid is on the left and on the top of the first color filter layer.

17. The image sensor of claim 16, further comprising a first light-absorbing grid surrounding the second color filter layer of one of the sensing pixels on the right of the PDAF pixel and a second light-absorbing grid surrounding the second color filter layer of another one of the sensing pixels on the bottom of the PDAF pixel in the unit from the top view, wherein:

the first light-absorbing grid comprises a first portion and a second portion, the first portion of the first light-absorbing grid is on the right of the one of the sensing pixels, and a width of the first portion of the first light-absorbing grid is larger than a width of the second portion of the first light-absorbing grid; and the second light-absorbing grid comprises a first portion and a second portion, the first portion of the second light-absorbing grid is on the bottom of the another one of the sensing pixels, and a width of the first portion of the second light-absorbing grid is larger than a width of the second portion of the second light-absorbing grid.

18. The image sensor of claim 1, further comprising light-absorbing grids respectively surrounding the second color filter layers of the sensing pixels in the unit, wherein from the top view, the light-absorbing grids comprises portions on a side of the PDAF pixel opposite to a side of the PDAF pixel next to the first portion of the light-shielding grid, the width of the first portion of the light-shielding grid and widths of the portions of the light-absorbing grids are equal to $W_0+(E_0+ND*E_{MAX})$, $W_0$ is from 50 nm to 150 nm, $E_0$ is from 0 to ¼ times a length of one of the four photodiodes of the PDAF pixel, $E_{MAX}$ is from 0 to ⅓ times the length, ND is equal to $D/D_{MAX}$, D is a distance between the center of the substrate and the center of the unit, and $D_{MAX}$ is a distance between the center of the substrate and an edge of the substrate farthest away from the center of substrate.

19. The image sensor of claim 1, wherein from the top view, a connection line is defined to connect the center of the substrate and a center of the unit, an angle $\phi$ is between the connection line and a positive X-axis of the substrate extending from the center of the substrate to a right edge of the substrate, the first portion of the light-shielding grid comprises a first width equal to $W_0+((E_0+ND*E_{MAX})*|\cos[(\phi/180°)*\pi]|)$ and a second width equal to $W_0+((E_0+ND*E_{MAX})*|\sin[(\phi/180°)*\pi]|)$, $W_0$ is from 50 nm to 150 nm, $E_0$ is from 0 to ¼ times a length of one of the four photodiodes of the PDAF pixel, $E_{MAX}$ is from 0 to ⅓ times the length, ND is equal to $D/D_{MAX}$, D is a distance between the center of the substrate and the center of the unit, and $D_{MAX}$ is a distance between the center of the substrate and an edge of the substrate farthest away from the center of substrate.

20. The image sensor of claim 19, further comprising light-absorbing grids respectively surrounding the second color filter layers of the sensing pixels in the unit, wherein from the top view, the light-absorbing grids comprises first portions on a side of the PDAF pixel opposite to a side of the PDAF pixel next to the first width of the first portion of the light-shielding grid and second portions on a side of the PDAF pixel opposite to a side of the PDAF pixel next to the second width of the first portion of the light-shielding grid, widths of the first portions of the light-absorbing grids are equal to $W_0+((E_0+ND*E_{MAX})*|\cos[(\phi/180°*\pi]|)$, and widths of the second portions of the light-absorbing grids are equal to $W_0 + ((E_0 + ND*E_{MAX})*|\sin[(\phi/180°)*\pi]|)$.

\* \* \* \* \*